US010658189B2

(12) United States Patent
Hatazaki et al.

(10) Patent No.: US 10,658,189 B2
(45) Date of Patent: May 19, 2020

(54) ETCHING METHOD

(71) Applicant: Tokyo Electron Limited, Tokyo (JP)

(72) Inventors: Yoshinari Hatazaki, Miyagi (JP); Wakako Ishida, Miyagi (JP); Kensuke Taniguchi, Hwaseong-si (KR)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/069,757

(22) PCT Filed: May 16, 2017

(86) PCT No.: PCT/JP2017/018347
§ 371 (c)(1),
(2) Date: Jul. 12, 2018

(87) PCT Pub. No.: WO2017/208807
PCT Pub. Date: Dec. 7, 2017

(65) Prior Publication Data
US 2019/0080917 A1 Mar. 14, 2019

(30) Foreign Application Priority Data
May 30, 2016 (JP) .................................. 2016-107370

(51) Int. Cl.
*H01L 21/3065* (2006.01)
*H01L 21/311* (2006.01)
(Continued)

(52) U.S. Cl.
CPC .... *H01L 21/3065* (2013.01); *H01J 37/32091* (2013.01); *H01J 37/32449* (2013.01);
(Continued)

(58) Field of Classification Search
None
See application file for complete search history.

(56) References Cited

U.S. PATENT DOCUMENTS 7,708,859 B2    5/2010  Huang et al.
2014/0051256 A1 2/2014  Zhong et al.
(Continued)

FOREIGN PATENT DOCUMENTS

EP    2 991 103 A1     3/2016
JP    2000-307001 A   11/2000
(Continued)

OTHER PUBLICATIONS

International Search Report for PCT/JP2017/018347 dated Jul. 11, 2017.

*Primary Examiner* — Jiong-Ping Lu
(74) *Attorney, Agent, or Firm* — Pearne & Gordon LLP

(57) ABSTRACT

A method of selectively etching a first region R1 made of silicon oxide with respect to a second region R2 made of silicon nitride by performing a plasma processing upon a processing target object is provided. The processing target object has the second region R2 forming a recess; the first region R1 configured to fill the recess; and a mask MK provided on the first region R1. The method includes a first process of generating plasma of a processing gas containing a fluorocarbon gas, and a second process of etching the first region with radicals of fluorocarbon contained in a deposit. In the second process, a high frequency power contributing to the generating of the plasma is applied in a pulse shape, and these processes are repeated.

18 Claims, 17 Drawing Sheets

(51) Int. Cl.
    *H01L 21/3213* (2006.01)
    *H01L 21/768* (2006.01)
    *H01J 37/32* (2006.01)
    *H01L 21/67* (2006.01)
    *H01L 21/683* (2006.01)

(52) U.S. Cl.
    CPC .. *H01L 21/31116* (2013.01); *H01L 21/31138* (2013.01); *H01L 21/31144* (2013.01); *H01L 21/32135* (2013.01); *H01L 21/32137* (2013.01); *H01L 21/67069* (2013.01); *H01L 21/768* (2013.01); *H01J 2237/334* (2013.01); *H01L 21/67109* (2013.01); *H01L 21/6831* (2013.01)

(56) References Cited

U.S. PATENT DOCUMENTS

| | | |
|---|---|---|
| 2015/0170965 A1 | 6/2015 | Indrakanti et al. |
| 2015/0348792 A1 | 12/2015 | Lee et al. |
| 2016/0064247 A1 * | 3/2016 | Tomura ............ H01L 21/76897 438/700 |

FOREIGN PATENT DOCUMENTS

| | | |
|---|---|---|
| JP | 2015-216208 A | 12/2015 |
| JP | 2016-027594 A | 2/2016 |
| JP | 2016-048771 A | 4/2016 |
| JP | 2016-058590 A | 4/2016 |

\* cited by examiner

ETCHING METHOD

CROSS-REFERENCE TO RELATED APPLICATION

This Application is a U.S. national phase application under 35 U.S.C. § 371 of PCT Application No. PCT/JP2017/018347 filed on May 16, 2017, which claims the benefit of Japanese Patent Application No. 2016-107370 filed on May 30, 2016, the entire disclosures of which are incorporated herein by reference.

TECHNICAL FIELD

The various embodiments described herein pertain generally to an etching method.

BACKGROUND ART

In the manufacture of an electronic device, a processing of forming an opening such as a hole or a trench on a region made of silicon oxide ($SiO_2$) may be performed. Generally, in this processing, the corresponding region is etched as a processing target object is exposed to plasma of a fluorocarbon gas, as described in Patent Document 1.

Further, there is known a technique of selectively etching a first region made of silicon oxide with respect to a second region made of silicon nitride. An example of such a technique, there is known SAC (Self-Aligned contact) technique. This SAC technique is described in Patent Document 2.

A processing target object as a processing target in this SAC technique has a first region made of silicon oxide, a second region made of silicon nitride and a mask. The second region is formed to have a recess, and the first region is configured to fill the recess and cover the second region. The mask is provided on the first region and is provided with an opening above the recess. In the conventional SAC technique, plasma of a processing gas containing a fluorocarbon gas, an oxygen gas and a rare gas is used to etch the first region, as disclosed in Patent Document 2. By exposing the processing target object to the plasma of this processing gas, a portion of the first region exposed through the opening of the mask is etched, so that an upper opening is formed. Further, as the processing target object is exposed to the plasma of the processing gas, a portion surrounded by the second region, that is, the first region within the recess is etched in a self-aligned manner. As a result, a lower opening continuous with the upper opening is formed in the self-aligned manner.

Further, there are also known a technique using an organic film as an etching target (Patent Document 3), a technique using silicon as an etching target (Patent Document 4) and a technique of etching $SiO_2$ after pulse-etching an organic film (Patent Document 5).

Patent Document 1: U.S. Pat. No. 7,708,859

Patent Document 2: Japanese Patent Laid-open Publication No. 2000-307001

Patent Document 3: US Patent Application Publication No. 2014/0051256

Patent Document 4: US Patent Application Publication No. 2015/0348792

Patent Document 5: US Patent Application Publication No. 2015/0170965

DISCLOSURE OF THE INVENTION

Problems to be Solved by the Invention

According to investigations of the present inventors, in the prior art, it is found out that a deposit re-adheres to the inside of the recess when selectively etching the first region made of the silicon oxide, thus making it difficult to etch the inside of the recess with high accuracy. In this regard, it is required to etch the first region with high accuracy in the state that the selective etching thereof is possible.

Means for Solving the Problems

In an exemplary embodiment, there is provided a method of selectively etching a first region made of silicon oxide with respect to a second region made of silicon nitride through a plasma processing upon a processing target object. The processing target object has the second region forming a recess; the first region configured to fill the recess and cover the second region; and a mask provided on the first region. The mask is provided with, above the recess, an opening having a width larger than a width of the recess. The method includes a first process of forming a deposit containing fluorocarbon on the processing target object by generating plasma of a processing gas containing a fluorocarbon gas within a processing vessel in which the processing target object is accommodated, and a second process of etching the first region with radicals of the fluorocarbon contained in the deposit, and applying a high frequency power contributing to the generating of the plasma in a pulse shape. A sequence including the first process and the second process are repeated.

Since this method includes the second process of selectively etching the first region made of the silicon oxide by the radicals of fluorocarbon, the first region is etched, while the etching of the second region made of the silicon nitride is suppressed.

Further, in the first process, the deposit is formed by the plasma of the processing gas containing the fluorocarbon gas or the processing gas containing the fluorocarbon gas and an inert gas. Further, an amount of the deposit is appropriately reduced by active species of oxygen.

In the second process, if the high frequency power is applied in the pulse shape, sputtered silicon oxide can be released to the outside of the recess in an OFF period during which the pulse is not applied. Thus, re-adhesion of the silicon oxide to the inside of the recess is suppressed, so that the etching can be performed with high accuracy. Further, as the OFF period of the pulse is provided, excessive acceleration of the ions can be suppressed, so that excessive etching at an opening edge of the recess can also be suppressed.

The etching of the second process is performed by a processing gas which does not substantially contain oxygen. In this method, the selective etching of the first region with respect to the second region is efficiently performed. Further, the expression of "does not substantially contain oxygen" implies that oxygen is not intentionally introduced into the processing gas.

The plasma of the first process is generated from a processing gas containing the fluorocarbon gas, an oxygen-containing gas and an inert gas. The plasma of these gases is capable of forming the deposit on the first region and the second region and capable of selectively etching the silicon oxide by applying energy to the deposit.

In the second process, the high frequency power of the pulse shape is generated by applying a first high frequency power for plasma generation to an upper electrode provided above the processing target object within the processing vessel; applying a second high frequency power for ion attraction to a lower electrode provided under the processing target object; and performing a modulation of alternately switching a period during which the first high frequency power and the second high frequency power are ON and a period during which the first high frequency power and the second high frequency power are OFF. In this case, the excessive acceleration of the ions can be suppressed. Further, during the OFF period, an exhaust of a reaction byproduct, which is generated by the etching, can be accelerated.

A ratio (duty ratio) of the period during which the high frequency power of the pulse shape is ON to a pulse cycle is in a range from 10% to 70%. In this case, the etching amount of the silicon nitride located at the opening edge (shoulder portion) of the recess can be reduced.

A ratio (duty ratio) of the period during which the high frequency power of the pulse shape is ON to a pulse cycle is in a range from 50% to 60%. In this case, the etching amount of the silicon nitride located at the opening edge (shoulder portion) of the recess can be further reduced.

Effect of the Invention

According to the etching method of the exemplary embodiment as described above, it is possible to etch the first region with high accuracy.

DETAILED DESCRIPTION

Figure 1:
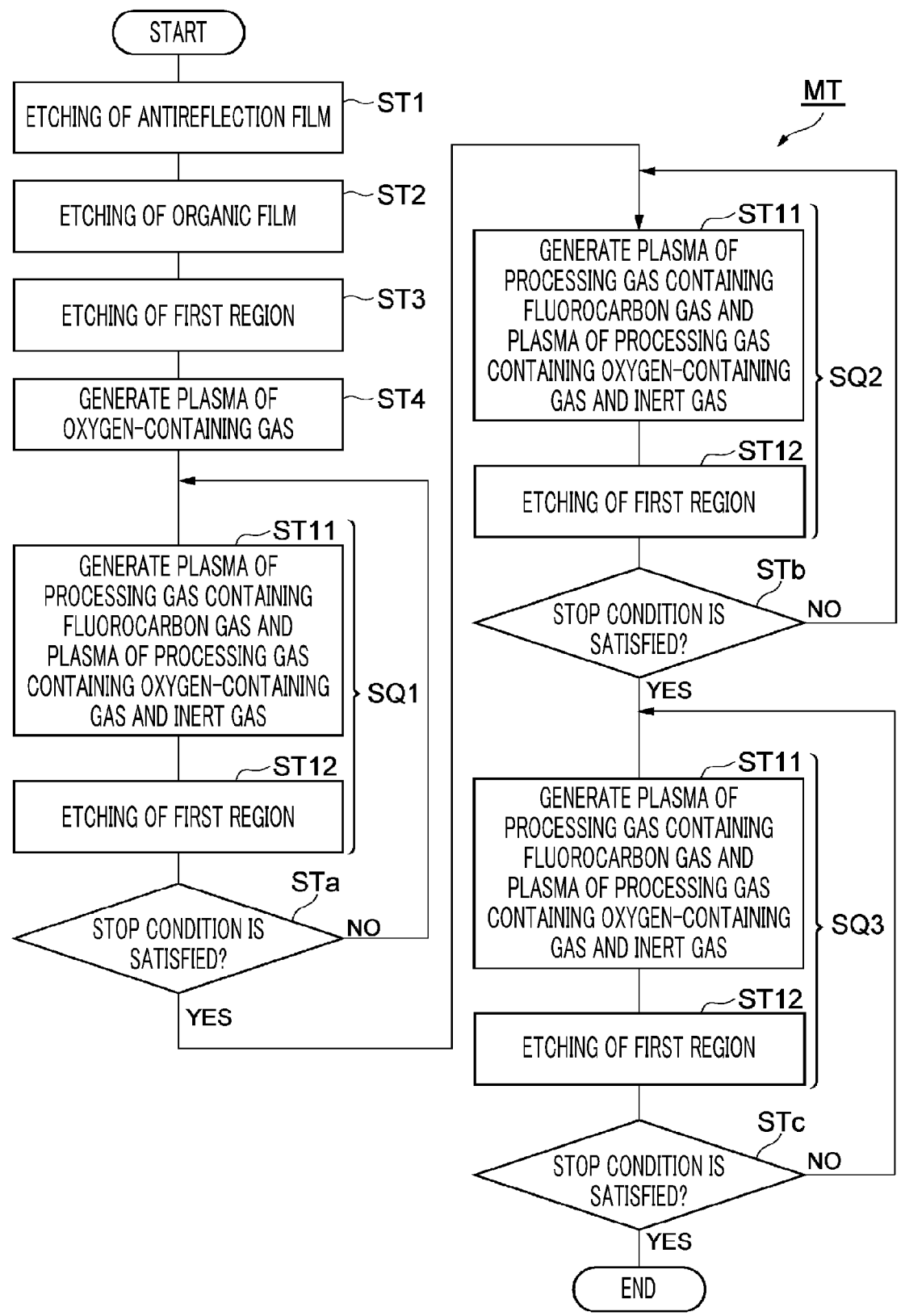
FIG. 1 is a flowchart illustrating an etching method according to an exemplary embodiment.

Hereinafter, various exemplary embodiments will be described with reference to accompanying drawings, which form a part of the description. In the various drawings, same or corresponding parts will be assigned same reference numerals.

FIG. 1 is a flowchart illustrating an etching method according to an exemplary embodiment. A method MT shown in FIG. 1 is a method of selectively etching a first region made of silicon oxide with respect to a second region made of silicon nitride by performing a plasma processing upon a processing target object.

Figure 2:
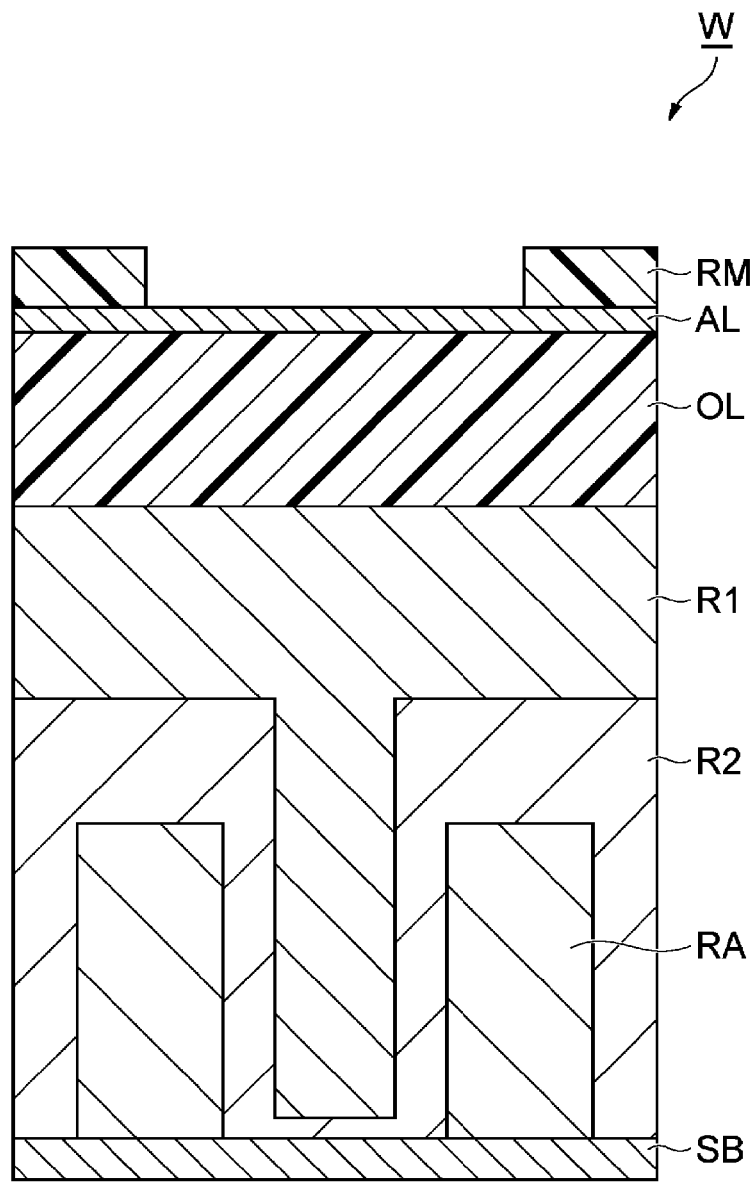
FIG. 2 is a cross sectional view illustrating a processing target object to which the etching method according to the exemplary embodiment is applied.

FIG. 2 is a cross sectional view illustrating the processing target object to which the etching method according to the exemplary embodiment is applied. As depicted in FIG. 2, the processing target object, that is, a wafer W has a substrate SB, a first region R1, a second region R2 and an organic film OL which constitutes a mask later. As an example, the wafer W is obtained in the course of manufacturing a fin type field effect transistor, and also has a protruding region RA, a silicon-containing antireflection film AL and a resist mask RM.

The protruding region RA is protruded from the substrate SB. This protruding region RA may constitute, for example, a gate region. The second region R2 is made of silicon nitride ($Si_3N_4$) and provided on a surface of the protruding region RA and a surface of the substrate SB. This second region R2 is extended to form a recess, as shown in FIG. 2. As an example, the recess has a depth of about 150 nm and a width of about 20 nm.

The first region R1 is made of silicon oxide ($SiO_2$) and provided on the second region R2. To elaborate, the first region R1 fills the recess formed by the second region R2 and covers the second region R2.

The organic film OL is provided on the first region R1. The organic film OL is made of an organic material such as, but not limited to, amorphous carbon. The antireflection film AL is provided on the organic film OL. The resist mask RM is provided on the antireflection film AL. The resist mask RM is provided with an opening above the recess formed by the second region R2. The opening of the resist mask RM has a larger width than the recess of the second region R2. For example, the width of the opening of the resist mask RM is, for example, 60 nm. The pattern of this resist mask RM is formed by a photolithography technique.

Figure 3:
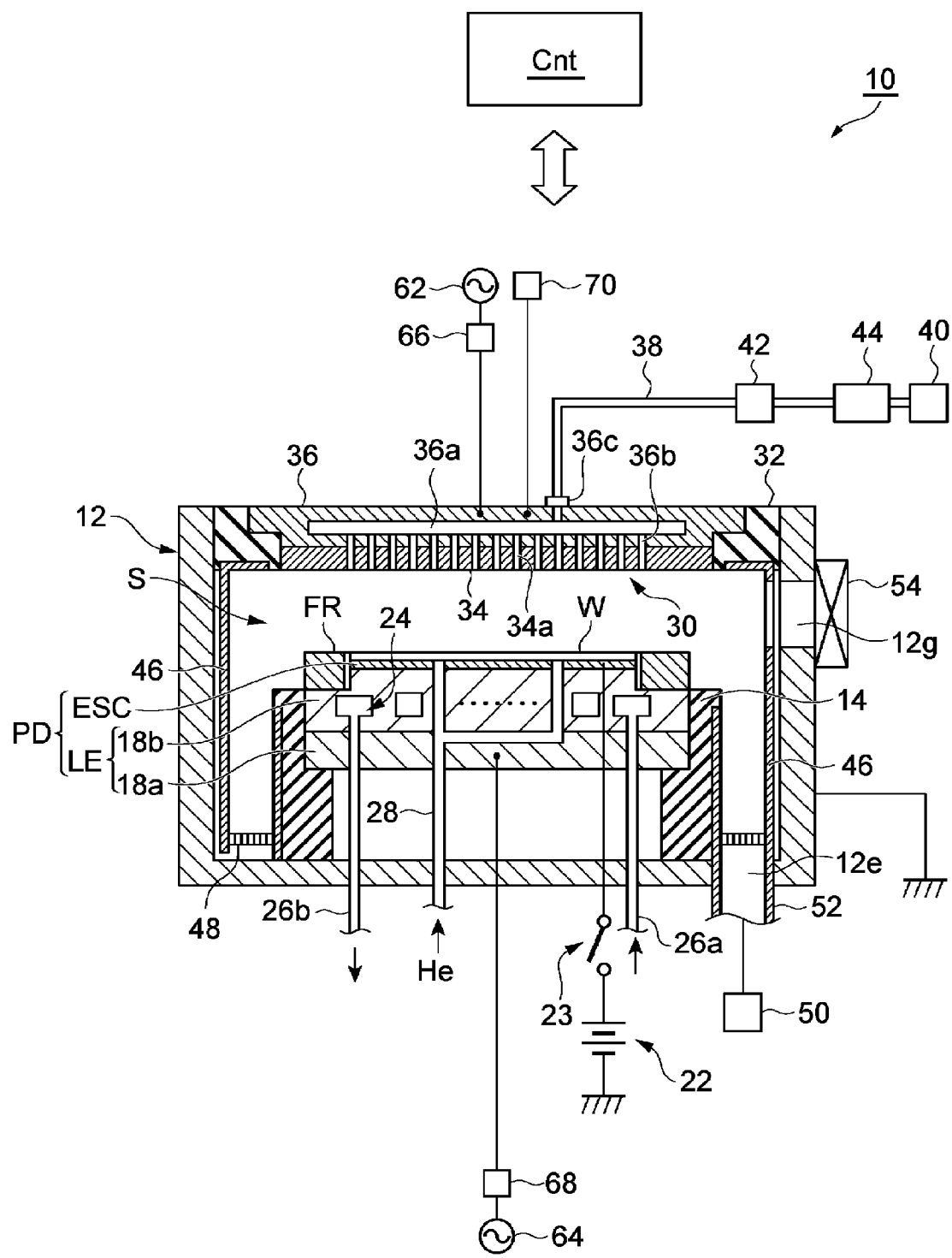
FIG. 3 is a diagram schematically illustrating an example of a plasma processing apparatus that can be used to perform the method shown in FIG. 1.

In the method MT, the processing target object such as the wafer W shown in FIG. 2 is processed in a plasma processing apparatus. FIG. 3 is a diagram schematically illustrating an example of the plasma processing apparatus which can be used to perform the method of FIG. 1. A plasma processing apparatus 10 shown in FIG. 3 is configured as a capacitively coupled plasma etching apparatus and is equipped with a substantially cylindrical processing vessel 12. An inner wall surface of the processing vessel 12 is made of, by way of non-limiting example, anodically oxidized aluminum. The processing vessel 12 is frame-grounded.

A substantially cylindrical supporting member 14 is provided on a bottom portion of the processing vessel 12. The supporting member 14 is made of, by way of example, but not limitation, an insulating material. Within the processing vessel 12, the supporting member 14 is vertically extended from the bottom portion of the processing vessel 12. Further, a mounting table PD is provided within the processing vessel 12. The mounting table PD is supported by the supporting member 14.

The mounting table PD is configured to hold the wafer W on a top surface thereof. The mounting table PD includes a lower electrode LE and an electrostatic chuck ESC. The lower electrode LE is provided with a first plate 18a and a second plate 18b. The first plate 18a and the second plate 18b are made of a metal such as, but not limited to, aluminum and have a substantially disk shape. The second plate 18b is provided on the first plate 18a and electrically connected with the first plate 18a.

The electrostatic chuck ESC is provided on the second plate 18b. The electrostatic chuck ESC includes a pair of insulating layers or insulating sheets; and an electrode, which serves as a conductive film, embedded therebetween. The electrode of the electrostatic chuck ESC is electrically connected to a DC power supply 22 via a switch 23. The electrostatic chuck ESC is configured to attract the wafer W by an electrostatic force such as a Coulomb force generated by a DC voltage applied from the DC power supply 22. Accordingly, the electrostatic chuck ESC is capable of holding the wafer W.

A focus ring FR is provided on a peripheral portion of the second plate 18b to surround an edge of the wafer W and the electrostatic chuck ESC. The focus ring FR is configured to improve etching uniformity. The focus ring FR is made of a material which is appropriately selected depending on a material of an etching target film. For example, the focus ring FR may be made of quartz.

A coolant path 24 is provided within the second plate 18b. The coolant path 24 constitutes a temperature controller. A coolant is supplied into the coolant path 24 from a chiller unit provided outside the processing vessel 12 via a pipeline 26a. The coolant supplied into the coolant path 24 is then returned back into the chiller unit via a pipeline 26b. In this way, the coolant is circulated between the coolant path 24 and the chiller unit. A temperature of the wafer W held by the electrostatic chuck ESC is controlled by adjusting a temperature of the coolant.

Furthermore, the plasma processing apparatus 10 is provided with a gas supply line 28. Through the gas supply line 28, a heat transfer gas, e.g., a He gas, is supplied from a heat transfer gas supply device into a gap between a top surface of the electrostatic chuck ESC and a rear surface of the wafer W.

Further, the plasma processing apparatus 10 includes an upper electrode 30. The upper electrode 30 is provided above the mounting table PD, facing the mounting table PD. The lower electrode LE and the upper electrode 30 are arranged to be substantially parallel to each other. Formed between the upper electrode 30 and the lower electrode LE is a processing space S in which a plasma processing is performed on the wafer W.

The upper electrode 30 is supported at an upper portion of the processing vessel 12 with an insulating shield member 32 therebetween. In the exemplary embodiment, the upper electrode 30 is configured such that a distance from the top surface of the mounting table PD, i.e., a mounting surface on which the wafer W is placed is variable in a vertical direction. The upper electrode 30 may include an electrode plate 34 and an electrode supporting body 36. The electrode plate 34 faces the processing space S, and is provided with a multiple number of gas discharge holes 34a. In the exemplary embodiment, the electrode plate 34 is made of silicon.

The electrode supporting body 36 is configured to support the electrode plate 34 in a detachable manner, and is made of a conductive material such as, but not limited to, aluminum. The electrode supporting body 36 may have a water-cooling structure. A gas diffusion space 36a is formed within the electrode supporting body 36. Multiple gas through holes 36b are extended downwards from the gas diffusion space 36a, and these gas through holes 36b communicate with the gas discharge holes 34a, respectively. Further, the electrode supporting body 36 is also provided with a gas inlet opening 36c through which a processing gas is introduced into the gas diffusion space 36a, and this gas inlet opening 36c is connected to a gas supply line 38.

The gas supply line 38 is connected to a gas source group 40 via a valve group 42 and a flow rate controller group 44. The gas source group 40 includes a plurality of gas sources. As an example, the gas source group 40 includes a source of one or more fluorocarbon gas, a source of a rare gas, a source of a nitrogen gas ($N_2$ gas), a source of a hydrogen gas ($H_2$ gas) and a source of oxygen-containing gas. The source of one or more fluorocarbon gas may include a source of a $C_4F_8$ gas, a source of a $CF_4$ gas and a source of a $C_4F_6$ gas. The source of the rare gas may be a source of a certain rare gas such as a He gas, a Ne gas, an Ar gas, a Kr gas and a Xe gas and, for example, is a source of the Ar gas. Further, the source of the oxygen-containing gas may be, for example, a source of oxygen gas ($O_2$ gas). The oxygen-containing gas may be a gas containing oxygen and, for example, may be carbon oxide gas such as a CO gas or $CO_2$ gas.

The valve group 42 includes a multiple number of valves, and the flow rate controller group 44 includes a multiple number of flow rate controllers such as mass flow controllers. Each of the gas sources belonging to the gas source group 40 is connected to the gas supply line 38 via each corresponding valve belonging to the valve group 42 and each corresponding flow rate controller belonging to the flow rate controller group 44.

Further, in the plasma processing apparatus 10, a deposition shield 46 is provided along an inner wall of the processing vessel 12 in a detachable manner. The deposition shield 46 is also provided on an outer side surface of the supporting member 14. The deposition shield 46 is configured to suppress an etching byproduct (deposit) from adhering to the processing vessel 12, and is formed by coating an aluminum member with ceramics such as $Y_2O_3$.

At the bottom side of the processing vessel 12, a gas exhaust plate 48 is provided between the supporting member 14 and a side wall of the processing vessel 12. The gas exhaust plate 48 may be made of, by way of example, an aluminum member coated with ceramics such as $Y_2O_3$. The processing vessel 12 is also provided with a gas exhaust opening 12e under the gas exhaust plate 48. The gas exhaust opening 12e is connected with a gas exhaust device 50 via a gas exhaust line 52. The gas exhaust device 50 includes a vacuum pump such as a turbo molecular pump, and is capable of decompressing the space within the processing vessel 12 to a required vacuum level. Further, a carry-in/out opening 12g for the wafer W is provided at the side wall of the processing vessel 12, and the carry-in/out opening 12g is opened or closed by a gate valve 54.

The plasma processing apparatus 10 further includes a first high frequency power supply 62 and a second high frequency power supply 64. The first high frequency power supply 62 is configured to generate a high frequency power for plasma generation having a frequency ranging from 27 MHz to 100 MHz. The first high frequency power supply 62 is connected to the upper electrode 30 via a matching device 66. The matching device 66 is a circuit configured to match an output impedance of the first high frequency power supply 62 and an input impedance at a load side (upper electrode 30 side). The first high frequency power supply 62 may be connected to the lower electrode LE via the matching device 66.

The second high frequency power supply 64 is configured to generate a high frequency bias power for ion attraction into the wafer W having a frequency ranging from 400 kHz to 40 MHz. The second high frequency power supply 64 is connected to the lower electrode LE via a matching device 68. The matching device 68 is a circuit configured to match an output impedance of the second high frequency power supply 64 and the input impedance at the load side (lower electrode LE).

Further, in an etching processing of a second process (Ar plasma etching), the first high frequency power for plasma generation is applied from the first high frequency power supply 62 to the upper electrode 30 provided above the processing target object within the processing vessel and the second high frequency power for ion attraction is applied from the second high frequency power supply 64 to the lower electrode LE provided under the processing target object. By performing a modulation in which a period during which the first and second high frequency powers are ON and a period during which the first and second high frequency powers are OFF are alternately switched, the high frequency powers are generated in a pulse shape.

That is, in a plasma processing of a first process (deposit formation), the aforementioned first high frequency power is applied as a continuous wave CW, whereas in the etching processing of the second process, the pulse-shaped high frequency powers are generated by performing the modulation in which the first and second high frequency powers are kept ON during the same period and kept OFF during the other same period. That is to say, the first and second high frequency powers are modulated into pulse signals to be respectively applied to the upper electrode 30 and the lower electrode LE. As a type of the pulse signal, a square-wave or the like may be used. A repetition frequency of the pulse signal used in the modulation may be set to be 5 kHz in the present exemplary embodiment. However, the same effect can be obtained if the repetition frequency is set to be in the range from 0.1 kHz to 50 kHz.

Further, the plasma processing apparatus 10 is further equipped with a power supply 70. The power supply 70 is connected to the upper electrode 30. The power supply 70 is configured to apply a voltage, to the upper electrode 30, for attracting positive ions existing in the processing space S into the electrode plate 34. As an example, the power supply 70 may be implemented by a DC power supply configured to generate a negative DC voltage. As another example, the power supply 70 may be implemented by an AC power supply configured to generate an AC voltage of a relatively low frequency. The voltage applied from the power supply 70 to the upper electrode 30 may be a voltage equal to or less than −150V. That is, the voltage applied from the power supply 70 to the upper electrode 30 may be a negative voltage having an absolute value equal to or larger than 150. If such a voltage is applied to the upper electrode 30 from the power supply 70, the positive ions existing in the processing space S collide with the electrode plate 34. Accordingly, secondary electrons and/or silicon may be released from the electrode plate 34. The released silicon bonds with active species of fluorine existing in the processing space S, so that the amount of the active species of fluorine is reduced.

Further, in the exemplary embodiment, the plasma processing apparatus 10 may further include a control unit Cnt. The control unit Cnt is implemented by a computer including a processor, a storage unit, an input device, a display device, and so forth, and is configured to control individual components of the plasma processing apparatus 10. In the control unit Cnt, an operator can input commands through the input device to manage the plasma processing apparatus 10, and an operational status of the plasma processing apparatus 10 can be visually displayed on the display device. Further, the storage unit of the control unit Cnt stores therein a control program for controlling various processings performed in the plasma processing apparatus 10 by the processor, or a program for allowing each component of the plasma processing apparatus 10 to perform a processing according to processing conditions, i.e., a processing recipe.

Now, referring back to FIG. 1, the method MT will be elaborated. In the following description, reference is made appropriately to FIG. 2 and FIG. 4 to FIG. 16 which are provided in time series. FIG. 4 to FIG. 15 are cross sectional views illustrating the processing target object in the course of performing the method MT, and FIG. 16 is a diagram for describing a comparative example. Further, the following description will be provided for an example where the wafer W shown in FIG. 2 is processed by the single plasma processing apparatus 10 illustrated in FIG. 3 in the method MT.

First, in the method MT, the wafer W shown in FIG. 2 is carried into the plasma processing apparatus 10, and the corresponding wafer W is placed on and held by the mounting table PD.

In the method MT, a process ST1 is then performed. In the process ST1, the antireflection film AL is etched. For the purpose, in the process ST1, a processing gas is supplied into the processing vessel 12 from a gas source selected from the plurality of gas sources belonging to the gas source group 40. This processing gas contains a fluorocarbon gas. The fluorocarbon gas may include one or more of, by way of example, a $C_4F_8$ gas and a $CF_4$ gas. Further, this processing gas may further include a rare gas such as, but not limited to, an Ar gas. Further, in the process ST1, the gas exhaust device 50 is operated, and the internal pressure of the processing vessel 12 is set to a preset pressure. Furthermore, in the process ST1, the high frequency power from the first high frequency power supply 62 and the high frequency bias power from the second high frequency power supply 64 are supplied to the lower electrode LE.

Below, examples of various conditions in the process ST1 are specified.

Figure 4:
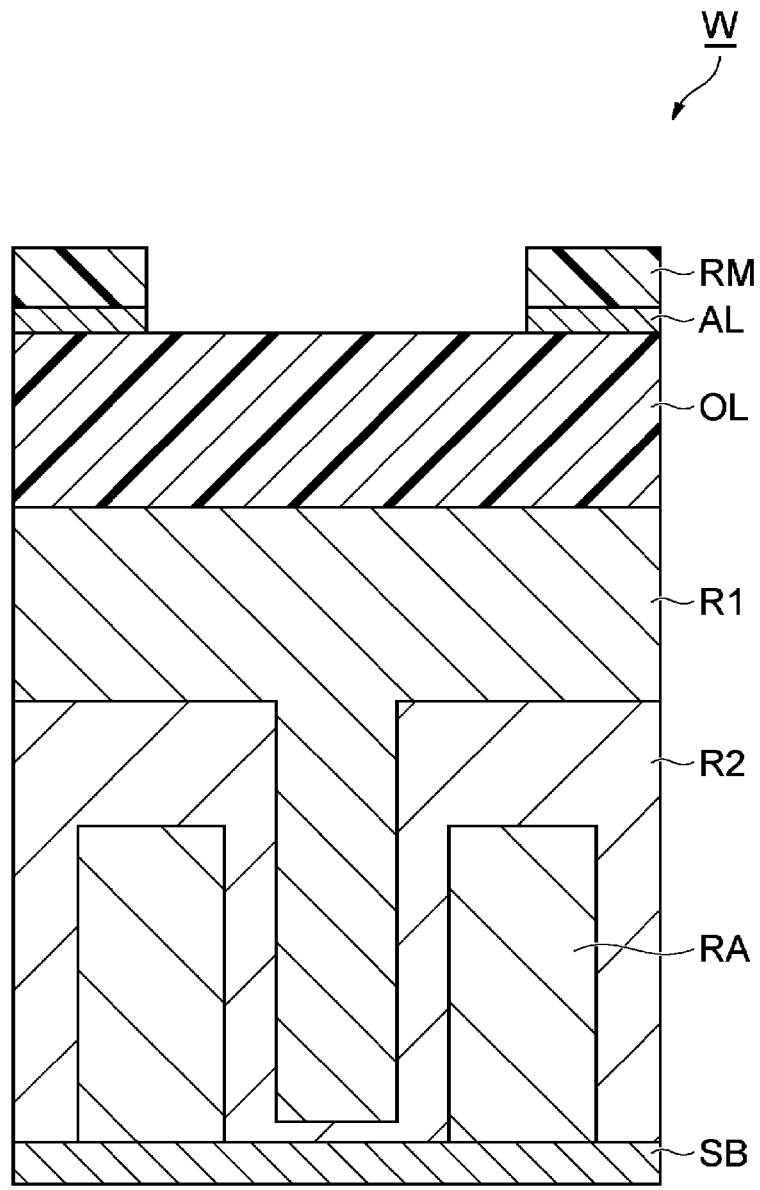
FIG. 4 is a cross sectional view illustrating the processing target object in the course of performing the method shown in FIG. 1.

Internal pressure of the processing vessel: 10 mTorr (1.33 Pa) to 50 mTorr (6.65 Pa)
  Processing Gas:
    $C_4F_8$ gas: 10 sccm to 30 sccm
    $CF_4$ gas: 150 sccm to 300 sccm
    Ar gas: 200 sccm to 500 sccm High frequency power for plasma generation: 300 W to 1000 W High frequency bias power: 200 W to 500 W In the process ST1, plasma of the processing gas is generated, and a portion of the antireflection film AL exposed through the opening of the resist mask RM is etched by the active species of fluorocarbon. As a result, as depicted in FIG. 4, the portion of the antireflection film AL exposed through the opening of the resist mask RM is removed. That is, the pattern of the resist mask RM is transcribed to the antireflection film AL, so that a pattern provided with an opening is formed in the antireflection film AL. Further, operations of the individual components of the above-described plasma processing apparatus 10 in the process ST1 may be controlled by the control unit Cnt.

In a subsequent process ST2, the organic film OL is etched. For the purpose, in the process ST2, a processing gas is supplied into the processing vessel 12 from gas sources selected from the plurality of gas sources belonging to the gas source group 40. This processing gas may contain a hydrogen gas and a nitrogen gas. Further, the processing gas used in the process ST2 may contain another gas such as, but not limited to, an oxygen gas, as long as it is capable of etching the organic film. Further, in the process ST2, the gas exhaust device 50 is operated, so that the internal pressure of the processing vessel 12 is set to a preset pressure. Furthermore, in the process ST2, the high frequency power from the first high frequency power supply 62 and the high frequency bias power from the second high frequency power supply 64 are supplied to the lower electrode LE.

Below, examples of various conditions in the process ST2 are specified.

Internal pressure of the processing vessel: 50 mTorr (6.65 Pa) to 200 mTorr (26.6 Pa)

Processing Gas:

$N_2$ gas: 200 sccm to 400 sccm $H_2$ gas: 200 sccm to 400 sccm

High frequency power for plasma generation: 500 W to 2000 W

High frequency bias power: 200 W to 500 W

Figure 5:
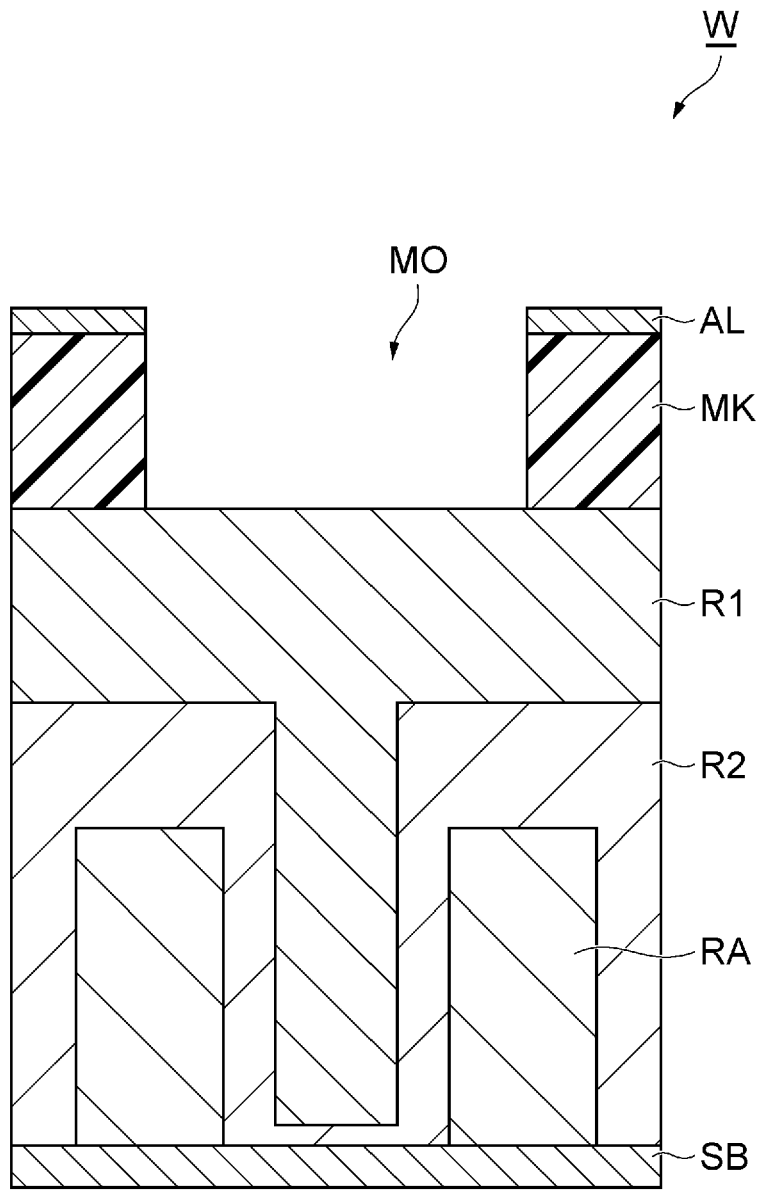
FIG. 5 is a cross sectional view illustrating the processing target object in the course of performing the method shown in FIG. 1.

In the process ST2, plasma of the processing gas is generated, and a portion of the organic film OL exposed through the opening of the antireflection film AL is etched. Further, the resist mask RM is also etched. As a result, as depicted in FIG. 5, the resist mask RM is removed, and the portion of the organic film OL exposed through the opening of the antireflection film AL is removed. That is, the pattern of the antireflection film AL is transcribed to the organic film OL, so that a pattern provided with an opening MO is formed in the organic film OL, and a mask MK originated from the corresponding organic film OL is generated. In addition, in the process ST2, operations of the individual components of the above-described plasma processing apparatus 10 may be controlled by the control unit Cnt.

According to the exemplary embodiment, a process ST3 is performed after the process ST2. In the process ST3, the first region R1 is etched until immediately before the second region R2 is exposed. That is, the first region R1 is etched until the first region R1 is slightly left on the second region R2. For the purpose, in the process ST3, a processing gas is supplied into the processing vessel 12 from a gas source selected from the plurality of gas sources belonging to the gas source group 40. This processing gas may contain a fluorocarbon gas. Further, this processing gas may further contain a rare gas such as, but not limited to, an Ar gas. Moreover, this processing gas may further contain an oxygen gas. In the process ST3, the gas exhaust device 50 is operated, so that the internal pressure of the processing vessel 12 is set to a preset pressure. Furthermore, in the process ST3, the high frequency power from the first high frequency power supply 62 and the high frequency bias power from the second high frequency power supply 64 are supplied to the lower electrode LE.

Figure 6:
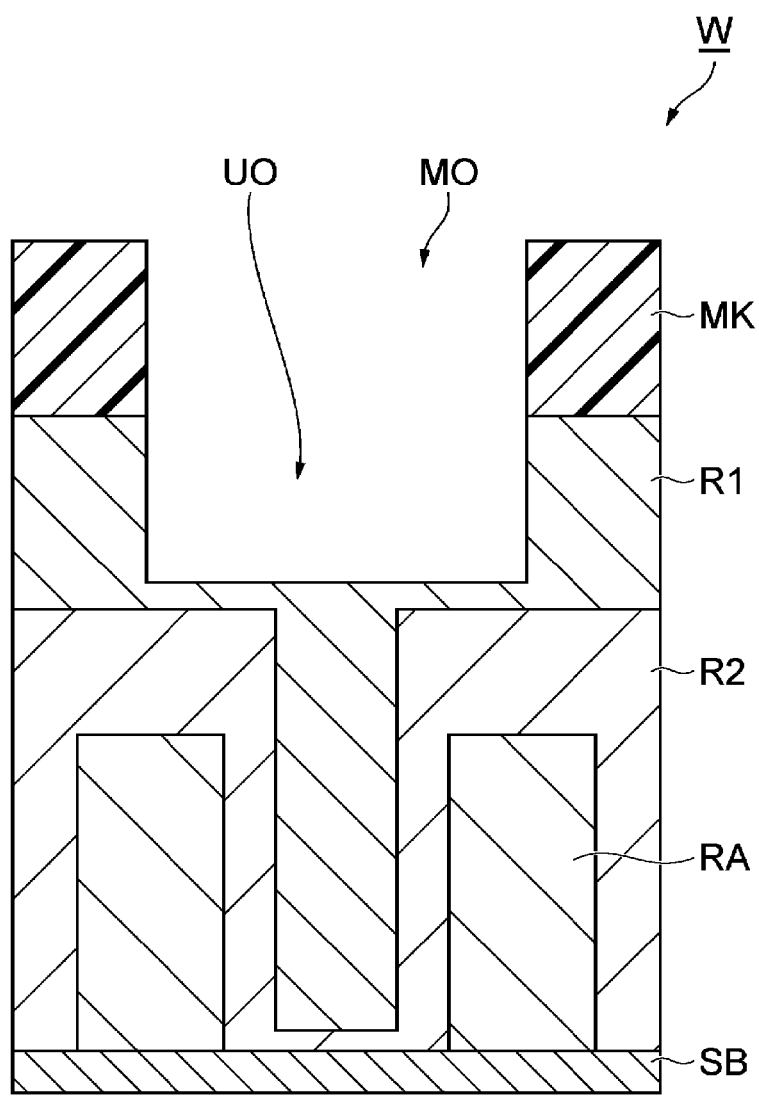
FIG. 6 is a cross sectional view illustrating the processing target object in the course of performing the method shown in FIG. 1.

In the process ST3, plasma of the processing gas is generated, and a portion of the first region R1 exposed through the opening of the mask MK is etched by the active species of fluorocarbon. A processing time of this process ST3 is set such that the first region R1 left on the second region R2 has a predetermined thickness upon the completion of the process ST3. As a result of performing this process ST3, an upper opening UO is partially formed, as illustrated in FIG. 6. Further, in the process ST3, operations of the individual components of the above-described plasma processing apparatus 10 may be controlled by the control unit Cnt.

Here, in a process ST11 to be described later, conditions are selected to create a mode in which formation of a fluorocarbon-containing deposit on the surface of the wafer W including the first region R1 is dominant over the etching of the first region R1, that is, a deposition mode. Meanwhile, in the process ST3, conditions are selected to create a mode in which the etching of the first region R1 is more dominant than the formation of the deposit, that is, an etching mode. For the purpose, as an example, the fluorocarbon gas used in the process ST3 may contain one or more of a $C_4F_8$ gas and a $CF_4$ gas. The fluorocarbon gas of this example is a fluorocarbon gas having a ratio of fluorine atoms with respect to carbon atoms (that is, a number of the fluorine atoms/a number of the carbon atoms) higher than a ratio of fluorine atoms with respect to carbon atoms (that is, a number of the fluorine atoms/a number of the carbon atoms) of the fluorocarbon gas used in the process ST11. Further, in the example, in order to increase the dissociation degree of the fluorocarbon gas, the high frequency power for plasma generation used in the process ST3 may be set to be larger than the high frequency power for plasma generation used in the process ST11. According to these examples, the etching mode can be implemented. Further, in the example, the high frequency bias power used in the process ST3 may also be set to be larger than the high frequency bias power used in the process ST11. According to this example, energy of ions attracted into the wafer W is increased, so that the first region R1 can be etched at a high rate.

Below, examples of various conditions in the process ST3 are specified.

Internal pressure of the processing vessel: 10 mTorr (1.33 Pa) to 50 mTorr (6.65 Pa)

Processing Gas:

$C_4F_8$ gas: 10 sccm to 30 sccm $CF_4$ gas: 50 sccm to 150 sccm

Ar gas: 500 sccm to 1000 sccm $O_2$ gas: 10 sccm to 30 sccm

High frequency power for plasma generation: 500 W to 2000 W

High frequency bias power: 500 W to 2000 W

In the exemplary embodiment, a process ST4 is then performed. In the process ST4, plasma of a processing gas containing an oxygen-containing gas is generated within the processing vessel 12. For the purpose, in the process ST4, the processing gas is supplied into the processing vessel 12 from gas sources selected from the plurality of gas sources belonging to the gas source group 40. As an example, this processing gas may contain an oxygen gas as the oxygen-containing gas. Further, this processing gas may further contain a rare gas (e.g., an Ar gas) or an inert gas such as a nitrogen gas. In the process ST4, the gas exhaust device 50 is operated, so that the internal pressure of the processing vessel 12 is set to a preset pressure. Further, in the process ST4, the high frequency power from the first high frequency power supply 62 is supplied to the lower electrode LE. In the process ST4, the high frequency bias power from the second high frequency power supply 64 may not be applied to the lower electrode LE.

Figure 7:
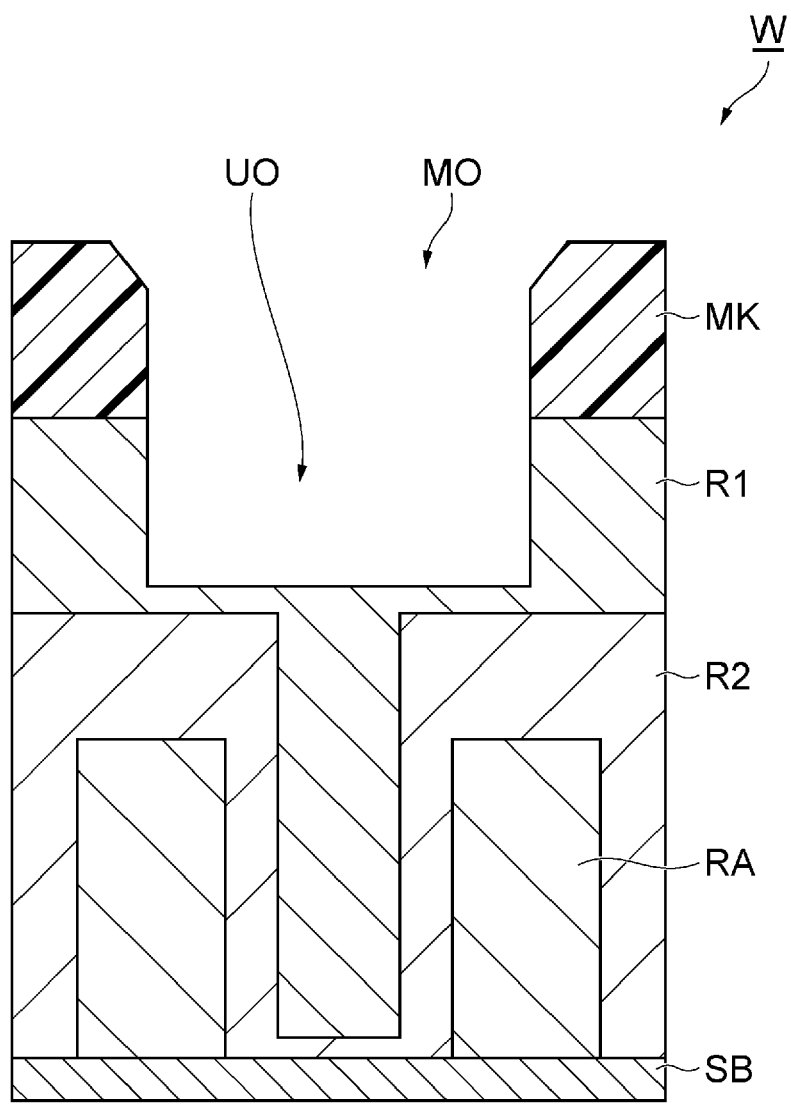
FIG. 7 is a cross sectional view illustrating the processing target object in the course of performing the method shown in FIG. 1.

In the process ST4, active species of oxygen are generated, and the opening MO of the mask MK is expanded at an upper end portion thereof by the active species of the oxygen. To elaborate, as depicted in FIG. 7, an upper shoulder portion of the mask MK confining the upper end portion of the opening MO is etched to have a taper shape. Accordingly, even if a deposit formed in the following processes adheres to a surface forming the opening MO of the mask MK, a decrement of a width of the opening MO can be reduced. Moreover, operations of the individual components of the above-described plasma processing apparatus 10 in the process ST4 may be controlled by the control unit Cnt.

Here, the process ST11 to be described later is also a process of reducing a small amount of the deposit formed in each sequence, and it is required to suppress an excessive decrease of the deposit. Meanwhile, the process ST4 is performed to increase the width of the upper end portion of the opening MO of the mask MK, and a processing time of the process ST4 needs to be short.

Below, examples of various conditions in the process ST4 are specified.

Internal pressure of the processing vessel: 30 mTorr (3.99 Pa) to 200 mTorr (26.6 Pa)

Processing Gas:

$O_2$ gas: 50 sccm to 500 sccm

Ar gas: 200 sccm to 1500 sccm

High frequency power for plasma generation: 100 W to 500 W

High frequency bias power: 0 W to 200 W

Subsequently, in the method MT, a sequence SQ1 is performed one or more times, and then, a sequence SQ2 is performed one or more times. Further, in the exemplary embodiment, if necessary, a sequence SQ3 may be performed one or more times after the sequence SQ2 is performed one or more times. These sequences SQ1, SQ2 and SQ3 are performed to etch the first region R1. Each of the sequences SQ1, SQ2 and SQ3 includes the process ST11 and a process ST12. Hereinafter, details of the process ST11 and the process ST12 which are commonly included in all the sequences SQ1, SQ2 and SQ3 will be described, and, then, a difference between the sequences SQ1, SQ2 and SQ3 will be discussed.

In each sequence, the process ST11 is performed as the first process. In the process ST11, plasma of a processing gas containing a fluorocarbon gas, an oxygen-containing gas and an inert gas is generated within the processing vessel 12 in which the wafer W is accommodated. For the purpose, in the process ST11, the processing gas is supplied into the processing vessel 12 from gas sources selected from the plurality of gas sources belonging to the gas source group 40. This processing gas contains the fluorocarbon gas, the oxygen-containing gas and the inert gas. In the process ST11, since the conditions for creating the deposition mode are selected as stated above, a $C_4F_6$ gas may be used as the fluorocarbon gas, for example. The oxygen-containing gas includes, by way of example, an oxygen gas, and the inert gas includes a rare gas such as, but not limited to, an Ar gas.

The inert gas may be a nitrogen gas. Further, in the process ST11, the gas exhaust device 50 is operated, and the internal pressure of the processing vessel 12 is set to a predetermined pressure. Further, in the process ST11, the high frequency power from the first high frequency power supply 62 may be supplied to the lower electrode LE.

Figure 8:
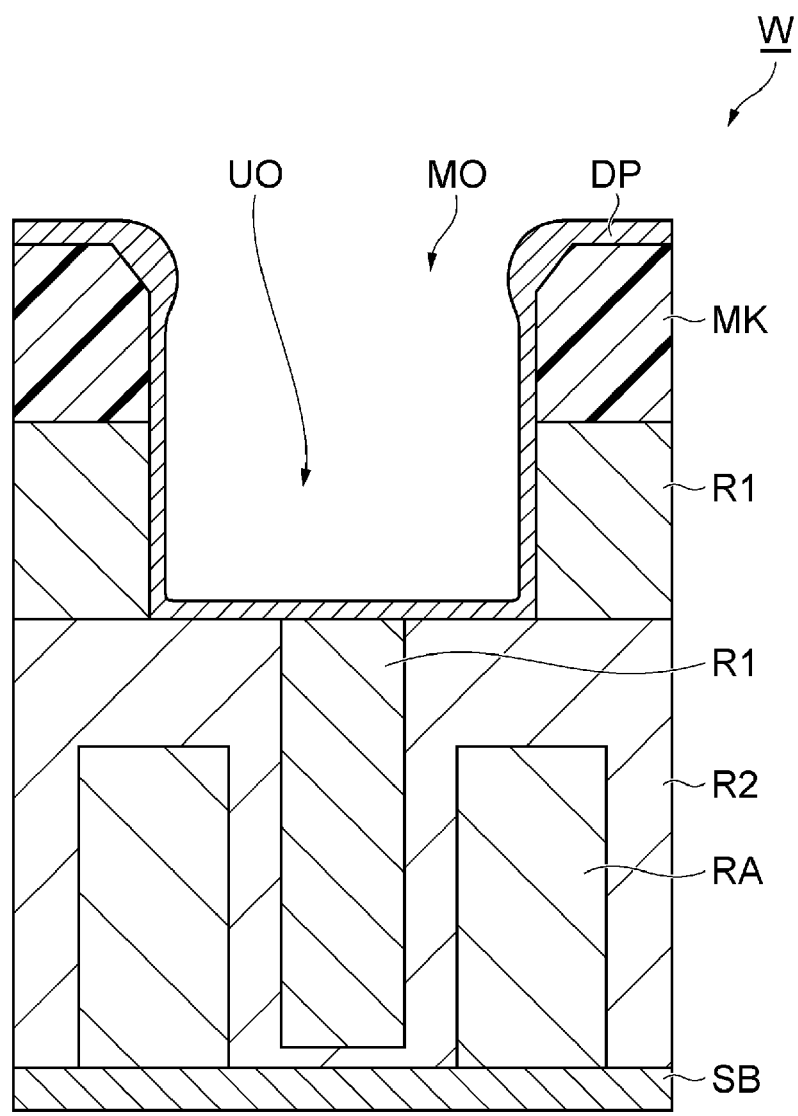
FIG. 8 is a cross sectional view illustrating the processing target object in the course of performing the method shown in FIG. 1.
Figure 11:
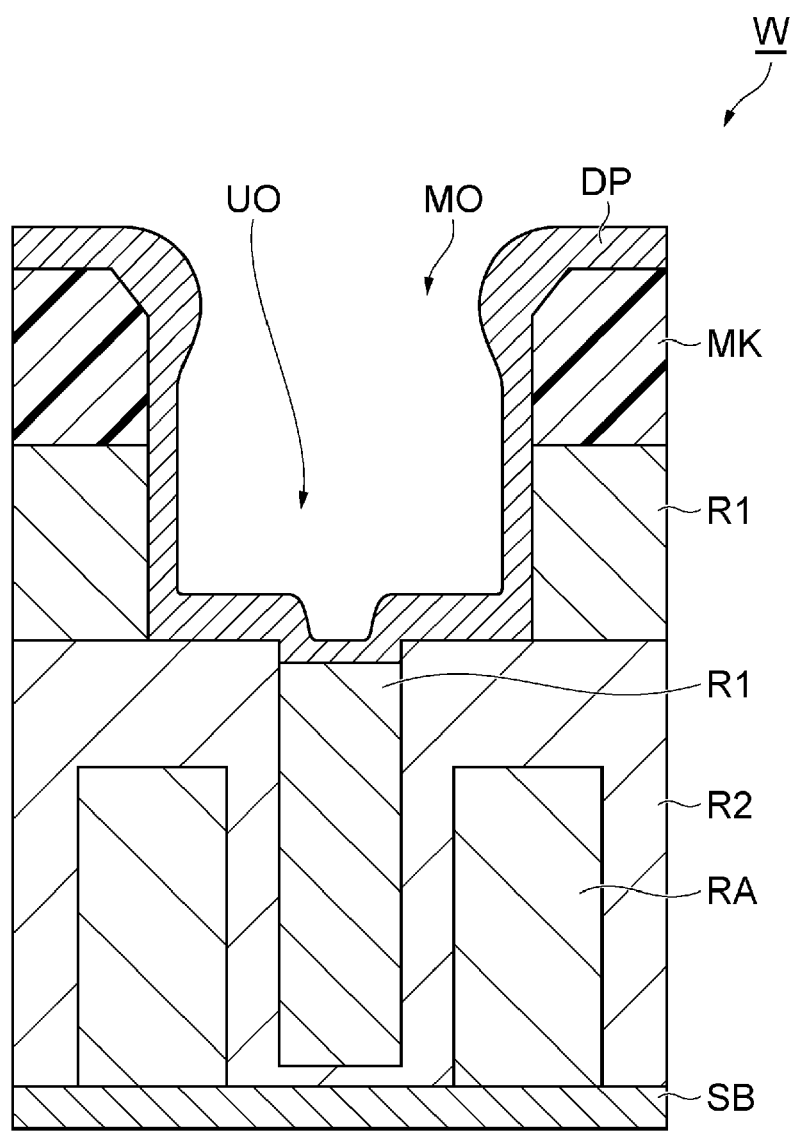
FIG. 11 is a cross sectional view illustrating the processing target object in the course of performing the method shown in FIG. 1.
Figure 14:
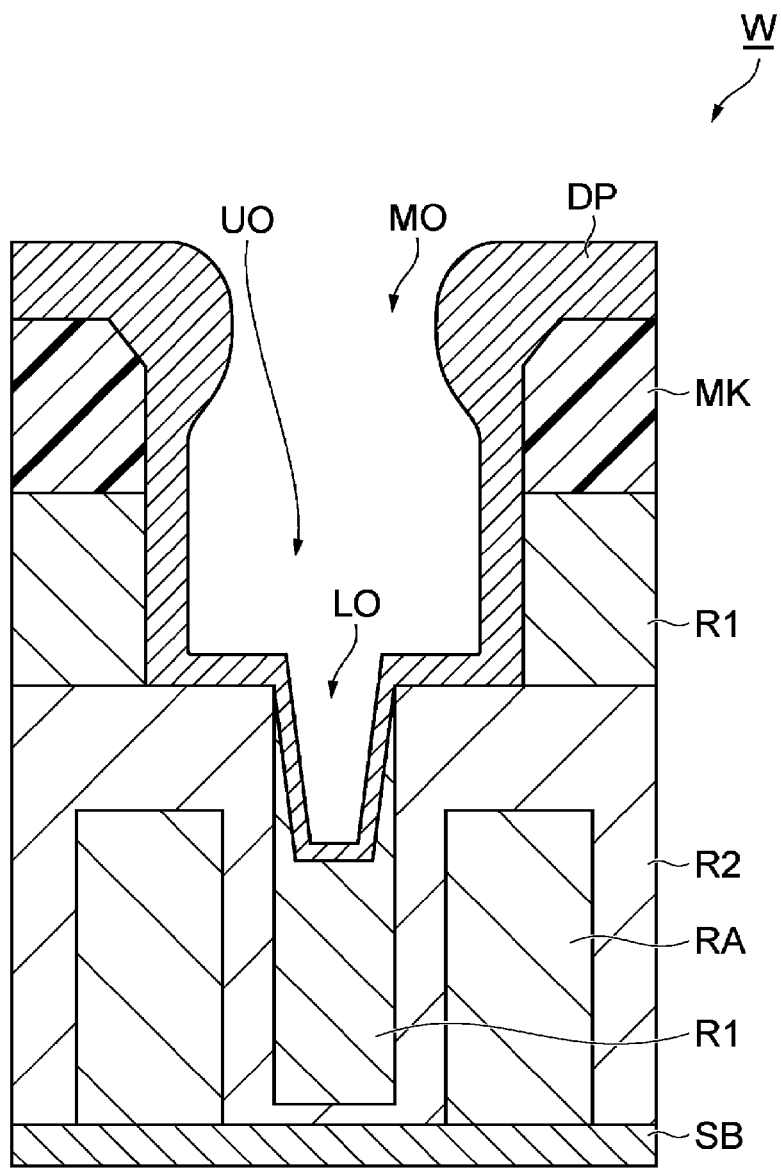
FIG. 14 is a cross sectional view illustrating the processing target object in the course of performing the method shown in FIG. 1.

In the process ST11, since the plasma of the processing gas containing the fluorocarbon gas or the processing gas containing the fluorocarbon gas and the inert gas is generated, dissociated fluorocarbon is deposited on the surface of the wafer W, so that a deposit DP is formed (see FIG. 8, FIG. 11 and FIG. 14). Operations of the individual components of the above-descried plasma processing apparatus 10 in the process ST11 may be controlled by the control unit Cnt.

Figure 9:
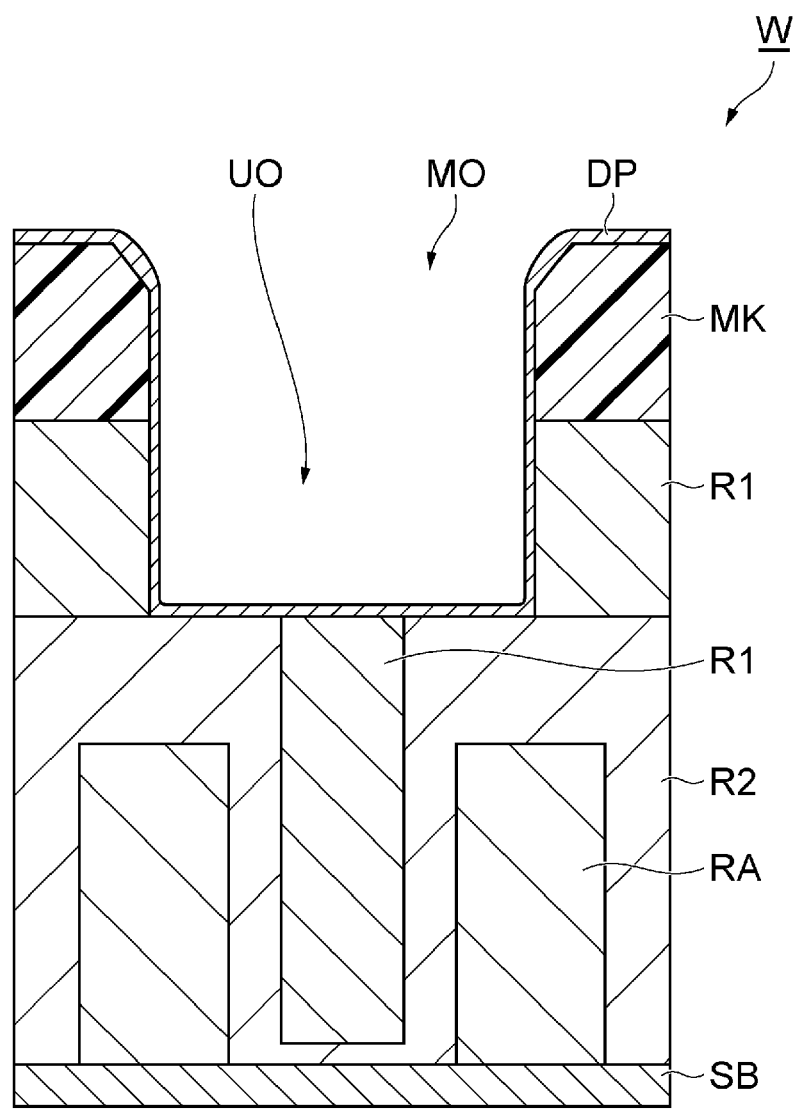
FIG. 9 is a cross sectional view illustrating the processing target object in the course of performing the method shown in FIG. 1.
Figure 12:
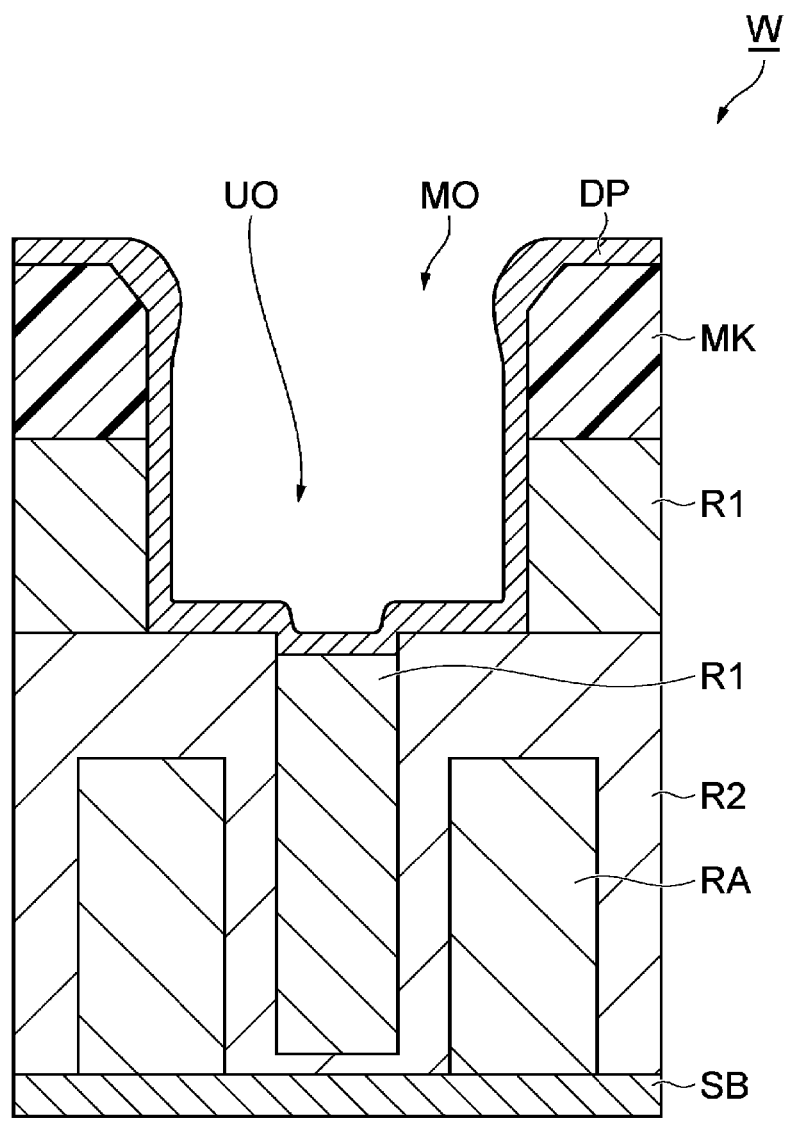
FIG. 12 is a cross sectional view illustrating the processing target object in the course of performing the method shown in FIG. 1.
Figure 15:
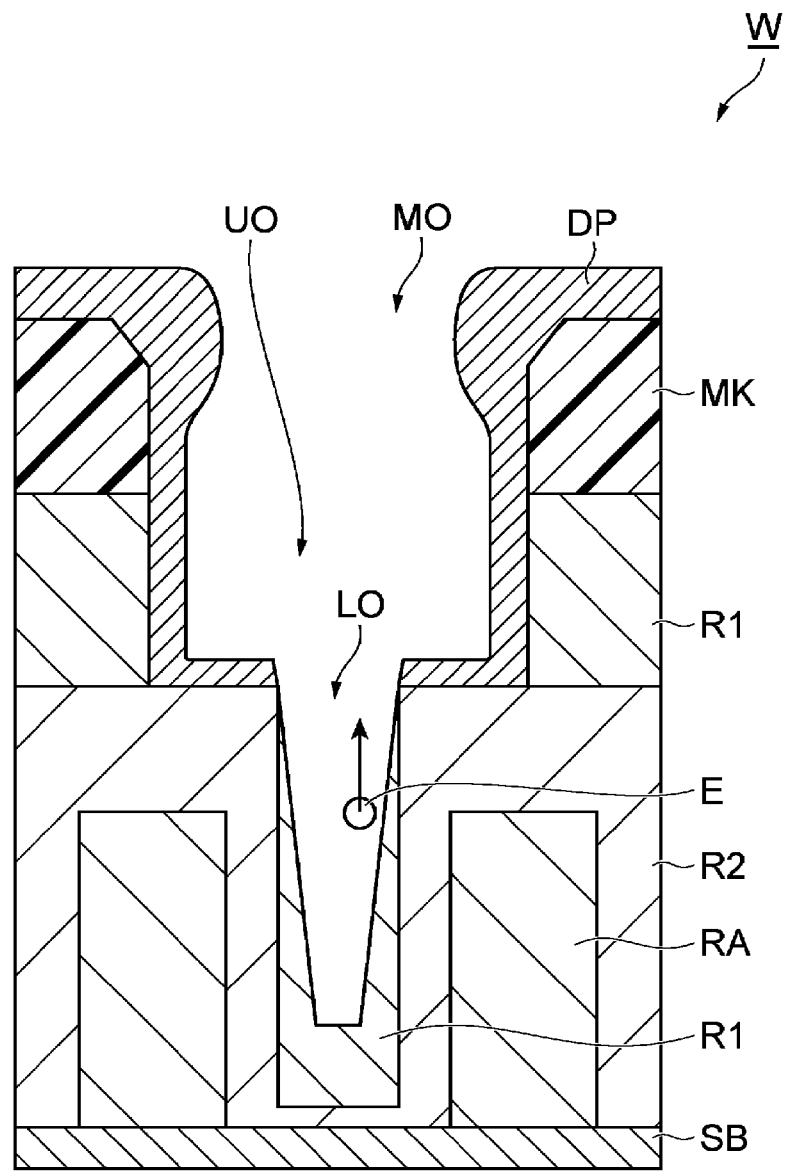
FIG. 15 is a cross sectional view illustrating the processing target object in the course of performing the method shown in FIG. 1.
Figure 16:
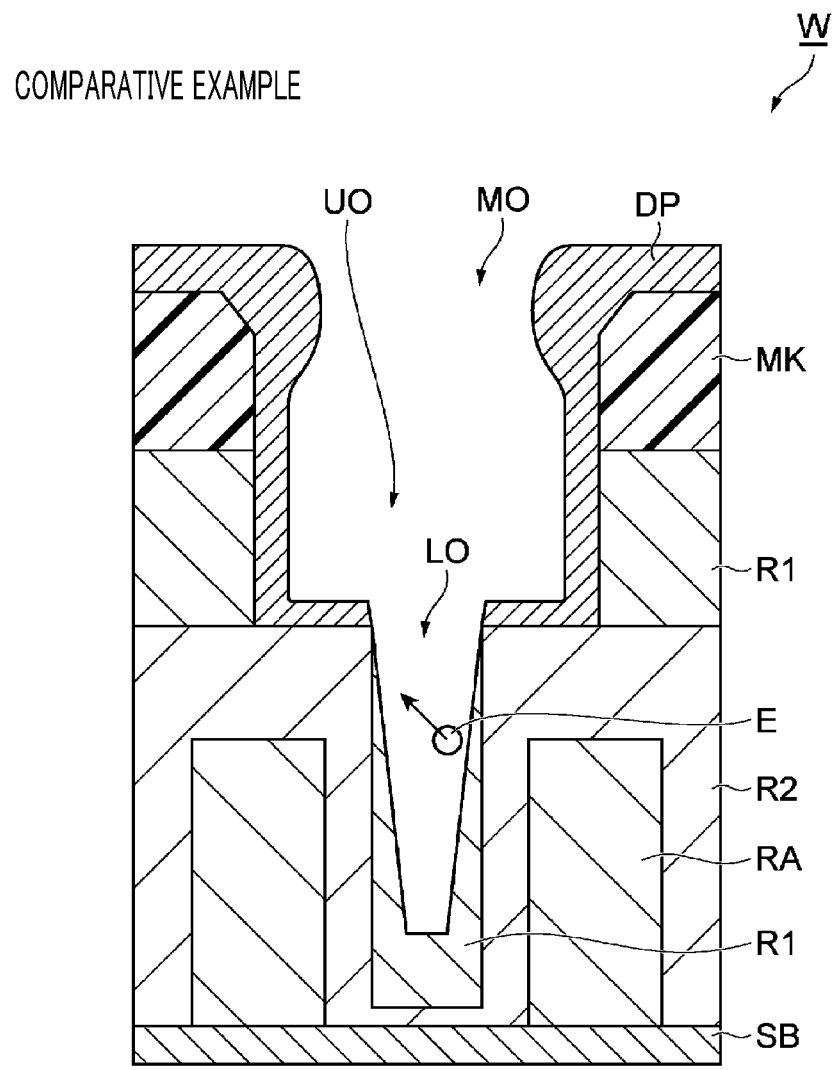
FIG. 16 is a cross sectional view illustrating a processing target object to describe a comparative example.

In the process ST11, during the time in which the deposit DP is formed by the fluorocarbon, active species of the oxygen are also generated, and the amount of the deposit DP on the wafer W is appropriately reduced by the corresponding oxygen active species (see FIG. 9, FIG. 12 and FIG. 15). The states shown in FIG. 8 and FIG. 9 are created in the process ST11 at the same time. As a result, the opening MO and the upper opening UO are suppressed from being clogged with the excessive deposit DP. Further, since the oxygen gas is diluted by the inert gas in the processing gas used in the process ST11, excessive removal of the deposit DP can be suppressed. Operations of the above-described individual components of the plasma processing apparatus 10 in the process ST11 may be controlled by the control unit Cnt.

Examples of various conditions in the process ST11 are specified as follows.

Internal pressure of the processing vessel: 10 mTorr to 50 mTorr

Processing Gas:

$C_4F_6$ gas flow rate: 1 sccm to 20 sccm

Ar gas flow rate: 200 sccm to 1500 sccm $O_2$ gas flow rate: 1 sccm to 20 sccm

High frequency power of first high frequency power supply 62: 40 MHz, 50 W to 500 W High frequency power (bias power) of second high frequency power supply 64: 13 MHz, 0 W to 50 W DC voltage of power supply 70: 0 V to −500 V No modulation of high frequency powers (CW (continuous wave))

In the exemplary embodiment, the process ST11 of each sequence, that is, a single cycle of the process ST11 is performed for 2 seconds or more, for example, 2.5 seconds to 3 seconds. A deposition time in the process ST11 is set to be 3 seconds in the first sequence SQ1 and 2.5 seconds (shorter than in the first sequence SQ1) in the second sequence SQ2. Accordingly, a thickness increment of a protective film on the silicon nitride can be appropriately controlled, so that release property can be improved. If an etching rate of the deposit DP in the period of this time length is too high, the deposit for protecting the second region R2 may be removed excessively. For this reason, in the process ST11, the deposit DP is etched at a rate of 1 nm/sec or less. Accordingly, the amount of the deposit DP on the wafer W can be appropriately adjusted. Furthermore, the etching rate of 1 nm/sec or less for the deposit DP in the process ST11 may be achieved by selecting the internal pressure of the processing vessel, the degree of dilution of the oxygen by the rare gas in the processing gas (that is, an oxygen concentration) and the high frequency power for plasma generation from the above-stated conditions. Besides, if the fluorocarbon gas, the inert gas and the oxygen gas are supplied in the overlapped (same) period in the process ST11, a stabilization time following a switchover of the processing gas and a stabilization time for electric discharge may not be put into consideration, as compared to a case of supplying the fluorocarbon gas and the oxygen gas in different periods. That is, the stabilization time following the switchover of the processing gas and the stabilization time for the electric discharge are not necessary, so that the throughput can be improved. In addition, it is desirable that a mole ratio between the fluorocarbon gas and the oxygen gas is in the range from 1:0.25 to 1:2 in the deposition process. In this case, an optimum thickness of the deposit for the designated power is obtained, so that micro loading and the release property can be improved. Moreover, in case of forming the opening shape by using the deposit, a plane shape of the opening may be of a circular shape, a rectangular shape, a slit shape or a long hole shape. Further, the formed opening is found out not to be distorted a lot but to be patterned as designed.

In each sequence, the process ST12 is subsequently performed. In the process ST12, the first region R1 is etched. For the purpose, in the process ST12, a processing gas is supplied into the processing vessel 12 from a gas source selected from the plurality of gas sources belonging to the gas source group 40. This processing gas contains an inert gas. As an example, the inert gas may be a rare gas such as an Ar gas. Alternatively, the inert gas may be a nitrogen gas. The etching in the process ST12 is performed by the processing gas which does not substantially contain oxygen. Here, the expression of "does not substantially contain oxygen" implies that oxygen is not intentionally introduced into the processing gas. Furthermore, in the process ST12, the gas exhaust device 50 is operated, so that the internal pressure of the processing vessel 12 is set to a predetermined pressure. Further, in the process ST12, the high frequency power from the first high frequency power supply 62 is supplied to the lower electrode LE. Further, in the process ST12, the high frequency bias power from the second high frequency power supply 64 is supplied to the lower electrode LE.

Examples of various conditions in the process ST12 are specified as follows.

Internal pressure of the processing vessel: 10 mTorr to 50 mTorr

Processing Gas:

Ar gas: 200 sccm to 1500 sccm

High frequency power of first high frequency power supply 62: 40 MHz, 50 W to 500 W High frequency power (bias power) of second high frequency power supply 64: 13 MHz, 25 W to 500 W DC voltage of power supply 70: 0 V to −500 V In the process ST12, plasma of the inert gas is generated, and ions are attracted into the wafer W. The first region R1 is etched by radicals of the fluorocarbon contained in the deposit DP (see FIG. 10, FIG. 13 and FIG. 15). Operations of the above-described individual components of the plasma processing apparatus 10 in the process ST12 may be controlled by the control unit Cnt.

Figure 10:
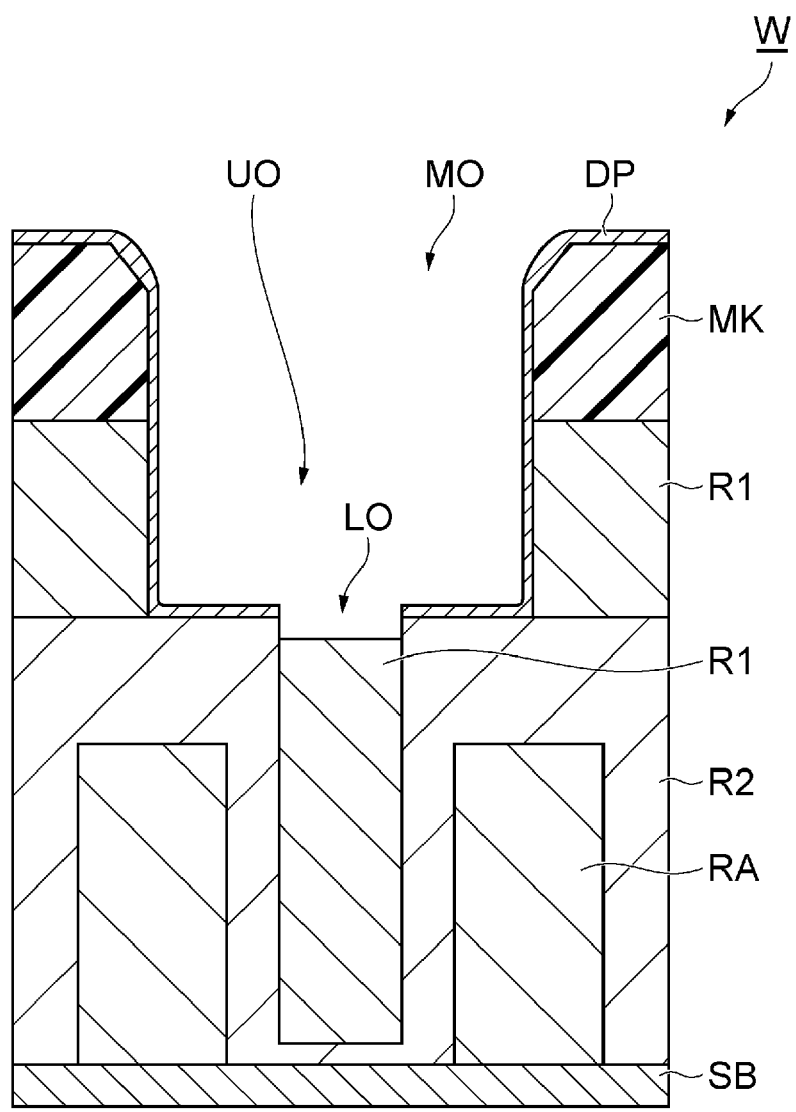
FIG. 10 is a cross sectional view illustrating the processing target object in the course of performing the method shown in FIG. 1.

In the method MT, the sequence SQ1 is performed in a period including a time when the second region R2 is exposed. In the process ST11 of the sequence SQ1, the deposit DP is formed on the wafer W, as illustrated in FIG. 8. FIG. 8 shows a state in which the second region R2 is exposed as the etching of the first region R1 progresses and then the deposit DP is formed on the corresponding second region R2. This deposit DP protects the second region R2. In the process ST11 of the sequence SQ1, the amount of the deposit DP formed in the same process ST11 is reduced, as depicted in FIG. 9. Then, in the process ST12 of the sequence SQ1, the first region R1 is etched by the radicals of the fluorocarbon contained in the deposit DP. Through this sequence SQ1, the second region R2 is exposed, and the first region R1 within the recess provided by the second region R2 is etched while the second region R2 is protected by the deposit DP. As a result, a lower opening LO is gradually formed, as depicted in FIG. 10.

The sequence SQ1 is repeated one or more times. As an example, the sequence SQ1 is repeated 39 times. As shown in FIG. 1, after the process ST12, it is determined in a process STa whether a stop condition is satisfied. The stop condition is satisfied when a repetition number of the sequence SQ1 reaches a preset number of times. If it is determined in the process STa that the stop condition is not satisfied, the sequence SQ1 is performed starting from the process ST11. Meanwhile, if it is determined in the process STa that the stop condition is met, the sequence SQ2 is subsequently performed. Further, in the second sequence SQ2, the high frequency bias power from the second high frequency power supply 64 may be set to be lower than that in the first sequence SQ1. An etching time in the second sequence SQ2 may be set to be longer than an etching time in the first sequence SQ1. Accordingly, while maintaining the release property, the etching of the silicon nitride can be suppressed.

Figure 13:
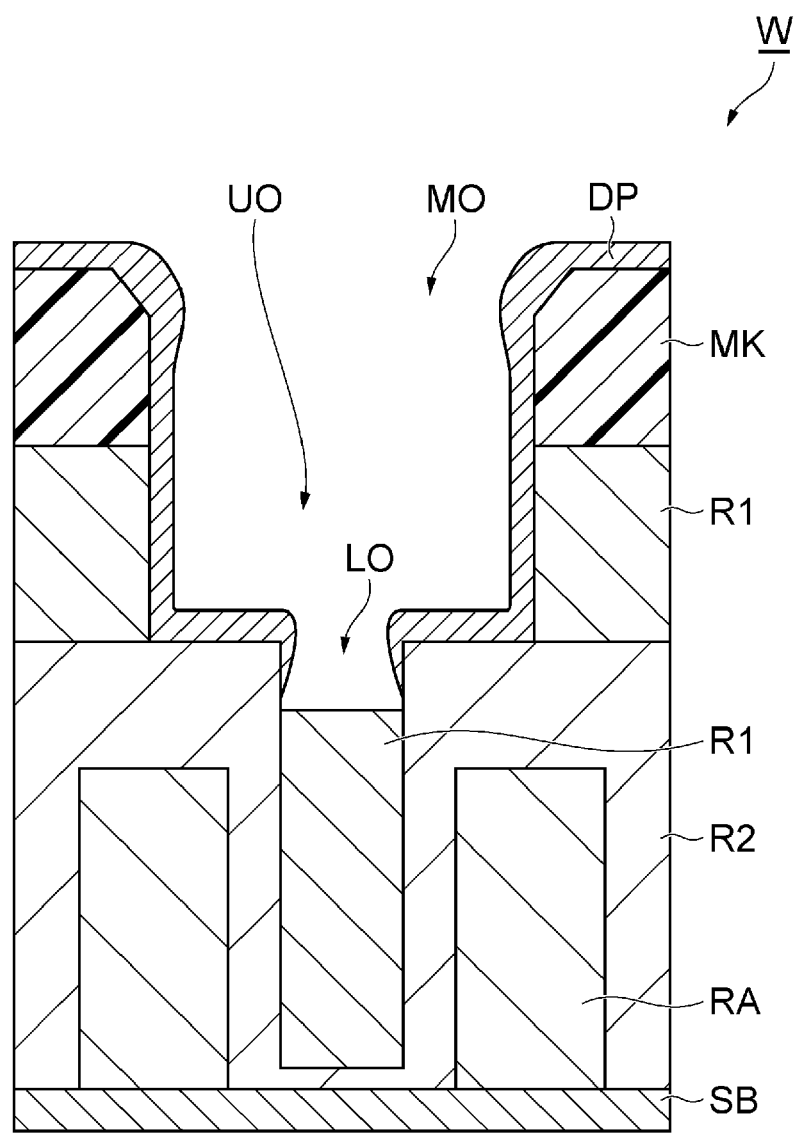
FIG. 13 is a cross sectional view illustrating the processing target object in the course of performing the method shown in FIG. 1.

In the process ST11 of the sequence SQ2, the deposit DP is formed on the wafer W, as depicted in FIG. 11. In the process ST11 of the sequence SQ2, the amount of the deposit DP formed in the same process ST11 is reduced, as illustrated in FIG. 12. Then, in the process ST12 of the sequence SQ2, the first region R1 is etched by the radicals of the fluorocarbon contained in the deposit DP. Through the sequence SQ2, the first region R1 within the recess provided by the second region R2 is further etched while the second region R2 is protected by the deposit DP. As a result, the lower opening LO is further deepened, as illustrated in FIG. 13.

Since the method according to the exemplary embodiment includes the second process of selectively etching the first region made of the silicon oxide by the radicals of the fluorocarbon, the first region is etched while the etching of the second region made of the silicon nitride is suppressed. Further, in the process ST11, the deposit DP is formed by the plasma of the processing gas containing the fluorocarbon gas or the processing gas containing the fluorocarbon gas and the inert gas. Furthermore, in the same process, the amount of the deposit DP on the wafer W is appropriately reduced by the active species of the oxygen. The formation of the deposit DP and the appropriate reduction of the amount of the deposit DP are performed in the same process, and the switchover of the processing gas is not required. Therefore, the stabilization time for the electric discharge caused by the switchover of the processing gas need not be considered.

Furthermore, in the method according to the exemplary embodiment, the etching of the second process is performed by the processing gas which does not substantially contain oxygen. In this method, the selective etching of the first region with respect to the second region is efficiently performed.

The sequence SQ2 is repeated one or more times. As an example, the sequence SQ2 is repeated 39 times. As shown in FIG. 1, after the process ST12, it is determined in a process STb whether a stop condition is satisfied. The stop condition is satisfied when a repetition number of the sequence SQ2 reaches a preset number of times. If it is determined in the process STb that the stop condition is not satisfied, the sequence SQ2 is performed starting from the process ST11. Meanwhile, if it is determined in the process STb that the stop condition is met, the sequence SQ2 is ended.

In the method MT, processing conditions for the sequence SQ1 are set such that an etching amount of the first region R1 in the sequence SQ1 of each cycle is smaller than an etching amount of the first region R1 in the sequence SQ2 of each cycle. As an example, a processing time of the sequence SQ1 of each cycle is set to be shorter than a processing time of the sequence SQ2 of each cycle. In this example, a ratio between a processing time of the process ST11 and a processing time of the process ST12 in the sequence SQ1 is set to be equal to a ratio between a processing time of the process ST11 and a processing time of the process ST12 in the sequence SQ2. By way of example, in the sequence SQ1, the processing time of the process ST11 is set to be in the range from 2 seconds to 5 seconds, and the processing time of the process ST12 is selected within the range from 5 seconds to 10 seconds. Further, in the sequence SQ2, the processing time of the process ST11 is set to be in the range from 2 seconds to 10 seconds, and the processing time of the process ST12 is selected within the range from 5 seconds to 20 seconds.

The active species of the fluorocarbon generated in the process ST11 are deposited on the second region R2, thus protecting the corresponding second region R2. If the second region R2 is exposed as the first region R1 is etched, the second region R2 can also be etched. Thus, in the method MT, the sequence SQ1 is performed one or more times (cycles) during a period in which the second region R2 is exposed. Accordingly, the deposit DP is formed on the wafer W while the etching amount thereof is suppressed, so that the second region R2 is protected by the deposit DP. Thereafter, the sequence SQ2 featuring a larger etching amount is performed one or more times (cycles). According to this method MT, it is possible to etch the first region R1 while suppressing the etching of the second region R2.

Further, since the deposit DP is already formed on the second region R2 in the sequence SQ1, the etching of the second region R2 can be suppressed even if the etching amount in each cycle of the sequence SQ2 is increased. In this way, by increasing the etching amount in each cycle of the sequence SQ2 to be larger than the etching amount in each cycle of the sequence SQ1, the etching rate of the first region R1 in the method MT can be increased.

In the method MT of the exemplary embodiment, if necessary, the sequence SQ3 may be further performed after the sequence SQ2. In the process ST11 of the sequence SQ3, while the deposit DP is formed on the wafer W, the amount of the deposit DP is reduced, as illustrated in FIG. 14. Then, in the process ST12 of the sequence SQ3, the first region R1 is etched with the radicals of the fluorocarbon contained in the deposit DP by Ar sputtering. Through this sequence SQ3, the first region R1 within the recess provided by the second region R2 is further etched while the second region R2 is protected by the deposit DP.

FIG. 16 is a diagram illustrating a state according to a comparative example corresponding to FIG. 15, and depicts a case where no pulse modulation is performed in the second process (continuous wave (CW)). In this case, molecules E of sputtered silicon oxide re-adhere to an inner surface of the recess. Further, excessive etching may occur at an opening edge (shoulder portion) of the recess, so that a part of the shoulder portion may be removed.

Meanwhile, in the exemplary embodiment of FIG. 15, the high frequency power is applied in the pulse shape in the second process. In this case, in the OFF period when the pulse is not applied, the sputtered silicon oxide can be released to the outside of the recess, so that re-adhesion of the silicon oxide to the inside of the recess is suppressed, and the highly accurate etching is enabled. Furthermore, as there exists the OFF period of the pulse, excessive acceleration of the ions can be suppressed, so that the excessive etching at the opening edge (shoulder portion) of the recess can also be suppressed.

The sequence SQ3 is repeated one or more times. As shown in FIG. 1, after the process ST12, it is determined in a process STc whether a stop condition is satisfied. The stop condition is satisfied when a repetition number of the sequence SQ3 reaches a preset number of times. If it is determined in the process STc that the stop condition is not satisfied, the sequence SQ3 is performed starting from the process ST11. Meanwhile, if it is determined in the process STc that the stop condition is met, the method MT is ended. Settings of all the sequences may be same.

In the process ST12 of the sequence SQ3, a power level of the high frequency bias power may be set to be higher than power levels of the high frequency bias powers used in the process ST12 of the sequence SQ1 and the sequence SQ2. By way of example, the high frequency bias powers in the process ST12 of the sequence SQ1 and the sequence SQ2 may be set to have a power level ranging from 20 W to 100 W, whereas the high frequency bias power in the process ST12 of the sequence SQ3 may be set to have a power level ranging from 100 W to 300 W. Further, in an example of the sequence SQ3, the processing time of the process ST11 may be set to be in the range from 2 sec to 10 sec, and the processing time of the process ST12 may be set to be in the range from 5 sec to 15 sec.

As depicted in FIG. 14, after the sequence SQ1 and the sequence SQ2 are performed, the amount of the deposit DP formed on the wafer W becomes considerably large. If the amount of the deposit DP is increased, a width of the opening MO, a width of the upper opening UO and a width of the lower opening LO may be narrowed due to the deposit DP. According to the exemplary embodiment, however, if the high frequency bias power having a relatively high power level is used in the process ST12 of the sequence SQ3, for example, energy of the ions attracted to the wafer W is increased, so that the ions can be supplied to a deep portion of the corresponding lower opening LO even if the lower opening LO is deep.

Further, an etching technique for the first region and the second region of the processing target object will be explained. A wafer W having a first region R1 and a second region R2 formed on a substrate is used, and the first region R1 is made of silicon oxide ($SiO_2$) and the second region R2 is made of silicon nitride ($Si_3N_4$). Various conditions for the processes ST11 and ST12 such as the internal pressure of the processing vessel are the same as specified above.

In the first process, if the process ST11 is performed on the wafer, a deposit DP is formed on the first region R1 and the second region R2 by plasma of a processing gas containing a fluorocarbon gas and an oxygen gas. As an example, a $C_4F_6$ gas is used as the fluorocarbon gas. The processing gas of the process ST11 may further contain a rare gas such as an Ar gas. In the process ST11, the amount of the deposit DP on the wafer W is appropriately reduced by active species of the oxygen further included in the processing gas.

In the second process, the process ST12 is performed on the wafer. The wafer W obtained after performing the process ST11 is exposed to plasma of a rare gas. The rare gas contains, by way of example, an Ar gas. After performing the process ST12, the first region R1 is etched by radicals of the fluorocarbon contained in the deposit DP.

In the process ST12, active species of rare gas atoms, by way of example, ions of Ar gas atoms collide with the deposit DP. Accordingly, the etching of the first region R1 is performed by the fluorocarbon radicals contained in the deposit DP, so that a thickness of the first region R1 is reduced. Further, on the first region R1, a film thickness of the deposit DP is also reduced. Meanwhile, though a thickness of the deposit DP on the second region R2 decreases, a decrement of the thickness of the second region R2 is remarkably smaller than a decrement of the thickness of the first region R1 because the etching of the second region R2 is suppressed.

There are conducted experiments in which the aforementioned recess is formed by performing the first process and the second process as described above. Conditions for the experiments are as follows in the above-described exemplary embodiment. Further, by increasing a magnitude of the high frequency power as a duty ratio of the pulse modulation in the second process is decreased, a total application power is set to be same in all the experimental examples. A number of cycles in the sequence is 39 times.

(Common Conditions)
(1) First Process ST11 (3 Sec)
Internal pressure of the processing vessel: 10 mTorr to 50 mTorr
Processing Gas:
$C_4F_6$ gas flow rate: 1 sccm to 20 sccm
Ar gas flow rate: 200 sccm to 1500 sccm
High frequency power of first high frequency power supply 62: 40 MHz, 50 W to 500 W
High frequency power (bias power) of second high frequency power supply 64: 13 MHz, 0 W to 50 W
DC voltage of power supply 70: 0 V to −500 V
(2) Second Process ST12 (9 Sec)
Internal pressure of the processing vessel: (3.99 Pa) 10 mTorr to 50 mTorr
Processing Gas:
Ar gas: (without containing oxygen) 200 sccm to 1500 sccm
High frequency power of first high frequency power supply 62: 40 MHz, 50 W to 500 W
High frequency power (bias power) of second high frequency power supply 64: 13 MHz, 25 W to 500 W
DC voltage of power supply 70: 0 V to −500 V The $C_4F_6$ gas flow rate, the Ar gas flow rate and the powers of the first and second high frequency power supplies used in the process ST11 to obtain this data are 8 sccm, 1100 sccm, 100 W and 0 W, respectively, in the above-specified ranges, and the Ar gas flow rate used in the second process ST12 is 1100 sccm in the above-specified range. The above-specified ranges of the various conditions are ranges where the same effects can be obtained even if these parameters are varied.

Further, conditions for the experimental examples when varying the parameters are as follows.

Experimental Example 1

$O_2$ gas flow rate in first process: 7 sccm
High frequency power of first high frequency power supply 62 in second process: 100 W
High frequency power (bias power) of second high frequency power supply 64 in second process: 50 W No pulse modulation of high frequency powers (CW (continuous wave)) in second process Experimental Example 2

$O_2$ gas flow rate in first process of experimental example 1: 6 sccm

Experimental Example 3

$O_2$ gas flow rate in first process of experimental example 1: 5 sccm

Experimental Example 4

$O_2$ gas flow rate in first process: 7 sccm
High frequency power of first high frequency power supply 62 in second process: 143 W
High frequency power (bias power) of second high frequency power supply 64 in second process: 71 W
Pulse modulation of high frequency powers in second process (duty ratio=70%)

Experimental Example 5

$O_2$ gas flow rate in first process of experimental example 4: 6 sccm

Experimental Example 6

$O_2$ gas flow rate in first process of experimental example 4: 5 sccm

Experimental Example 7

$O_2$ gas flow rate in first process of experimental example 4: 4 sccm

Experimental Example 8

$O_2$ gas flow rate in first process: 5 sccm
High frequency power of first high frequency power supply 62 in second process: 200 W
High frequency power (bias power) of second high frequency power supply 64 in second process: 100 W
Pulse modulation of high frequency powers in second process (duty ratio=50%)

Experimental Example 9

$O_2$ gas flow rate in first process of experimental example 8: 4 sccm

Experimental Example 10

$O_2$ gas flow rate in first process of experimental example 8: 3 sccm

Experimental Example 11

$O_2$ gas flow rate in first process of experimental example 8: 2 sccm

Experimental Example 12

$O_2$ gas flow rate in first process: 5 sccm
High frequency power of first high frequency power supply 62 in second process: 333 W High frequency power (bias power) of second high frequency power supply 64 in second process: 167 W Pulse modulation of high frequency powers in second process (duty ratio=30%)

Experimental Example 13

$O_2$ gas flow rate in first process of experimental example 12: 4 sccm

Experimental Example 14

$O_2$ gas flow rate in first process of experimental example 12: 3 sccm

Experimental Example 15

$O_2$ gas flow rate in first process of experimental example 12: 2 sccm

Experimental Results

In the experimental examples, the etching amount of the second region (silicon nitride) at the opening edge of the recess and presence/absence of poor release within the recess are as follows. Here, poor release indicates a case where a deposit is found to adhere to the inside of the recess when the inside of the recess is observed with an electron microscope.

Experimental example 1: 11.1 nm (good release)
Experimental example 2: 7.5 nm (poor release)
Experimental example 3: 6.8 nm (poor release)
Experimental example 4: 11.1 nm (good release)
Experimental example 5: 10.2 nm (good release)
Experimental example 6: 7.5 nm (poor release)
Experimental example 7: 4.3 nm (poor release)
Experimental example 8: 8.6 nm (good release)
Experimental example 9: 6.8 nm (good release)
Experimental example 10: 5.7 nm (poor release)
Experimental example 11: 3.9 nm (poor release)
Experimental example 12: 8 nm (good release)
Experimental example 13: 7.7 nm (good release)
Experimental example 14: 6.4 nm (good release)
Experimental example 15: 4.5 nm (poor release)

Figure 17:
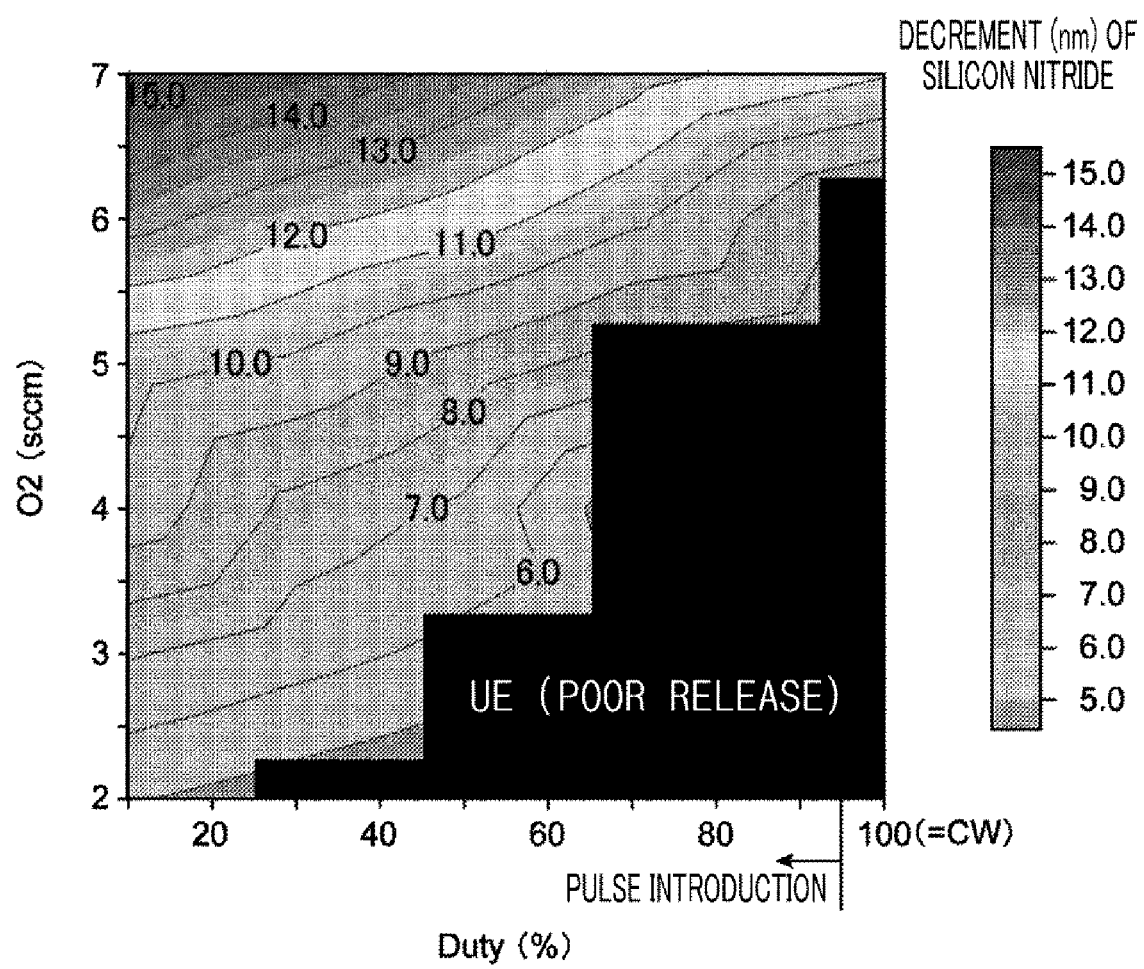
FIG. 17 is a diagram showing an experiment result.

FIG. 17 is a chart in which the above experimental results are shown.

As can be seen from the results, according to the above-described experimental examples, by performing the pulse modulation, the occurrence of the poor release is reduced regardless of the oxygen flow rate in the first process. Further, if the duty ratio in the second process is reduced, the occurrence of the poor release (UE) is found to be further reduced. If the oxygen flow rate in the first process is small, the removal amount of the silicon nitride at the opening edge is reduced, so that selective etching property is improved. Further, though the silicon nitride is found to be removed in the experimental example 1 as the excessive etching takes place at the shoulder portion of the recess, such a removal of the silicon nitride is not observed in the experimental example 10.

As described above, there is provided a method of selectively etching a first region made of silicon oxide with respect to a second region made of silicon nitride through a plasma processing upon a processing target object. The processing target object has the second region forming a recess; the first region configured to fill the recess and cover the second region; and a mask provided on the first region. The mask is provided with, above the recess, an opening having a width larger than a width of the recess. The method includes a first process of forming a deposit containing fluorocarbon on the processing target object by generating plasma of a processing gas containing a fluorocarbon gas within a processing vessel in which the processing target object is accommodated, and a second process of etching the first region with radicals of the fluorocarbon contained in the deposit, and applying a high frequency power contributing to the generating of the plasma in a pulse shape. A sequence including the first process and the second process are repeated.

According to this method, in the second process, since the high frequency power is applied in the pulse shape, the sputtered silicon oxide can be released to the outside of the recess in the OFF period during which the pulse is not applied, and the re-adhesion of the silicon oxide to the inside of the recess is suppressed, so that the highly accurate etching can be performed. Accordingly, as in the above-specified experimental results, as the duty ratio is reduced, the possibility of the occurrence of the poor release is reduced.

Further, since there exists the OFF period of the pulse, the excessive acceleration of the ions can be suppressed, so that the excessive etching at the opening edge of the recess is suppressed.

In the etching method, the plasma of the first process is generated from a processing gas containing the fluorocarbon gas, an oxygen-containing gas and an inert gas. The plasma of these gases is capable of forming the deposit on the first region and the second region, and capable of selectively etching the silicon oxide by adding energy to the deposit.

In the second process of the etching method, the high frequency power of the pulse shape is generated by applying a first high frequency power for plasma generation to an upper electrode provided above the processing target object within the processing vessel; applying a second high frequency power for ion attraction to a lower electrode provided under the processing target object; and performing a modulation of alternately switching a period during which the first high frequency power and the second high frequency power are ON and a period during which the first high frequency power and the second high frequency power are OFF. According to this method, through the pulse modulation, the poor release is reduced.

A ratio (duty ratio) of the period during which the high frequency power of the pulse shape is ON to a pulse cycle is in a range from 10% to 70%. In this case, the poor release is reduced as compared to a case where the duty ratio exceeds 70%. That is, the etching amount of the silicon nitride located at the opening edge (shoulder portion) of the recess can be reduced.

A ratio (duty ratio) of the period during which the high frequency power of the pulse shape is ON to a pulse cycle is in a range from 50% to 60%. In this case, it is found out that the poor release is further reduced as compared to a case where the duty ratio exceeds 60%.

EXPLANATION OF CODES

10: Plasma processing apparatus
12: Processing vessel
30: Upper electrode
PD: Lower electrode
ESC: Electrostatic chuck
40: Gas source group
42: Valve group 44: Flow rate controller group
50: Gas exhaust device
62: First high frequency power supply
64: Second high frequency power supply
Cnt: Control unit
W: Wafer
W1: Wafer
P1: First region
R2: Second region
OL: Organic film
AL: Antireflection film containing silicon
MK: Mask
DP: Deposit

We claim:

1. An etching method comprising: a) providing a target object in a processing chamber, the target object including a first region, a second region and a mask, the first region being made of a first silicon-containing material, the second region being made of a second material different from the first silicon-containing material, the first region being disposed on the second region, the second region having a recess, the recess being filled with the first region, the mask being disposed on the first region, the mask having an opening, the opening having a width larger than a width of the recess; b) generating a plasma from a fluorocarbon containing gas supplied into the processing chamber to form a fluorocarbon containing deposit on the target object; and c) applying a pulsed power to the processing chamber, thereby causing the first region to be etched with fluorocarbon radicals in the fluorocarbon containing deposit; and d) repeating b) and c), wherein the pulsed power includes a first power having a first frequency ranging from 27 MHz to 100 MHz and a second power having a second frequency ranging from 400 kHz to 40 MHz, wherein, in c), the pulsed power is generated by applying the first power for plasma generation to an upper electrode provided above the target object within the processing chamber; applying the second power for ion attraction to a lower electrode provided under the target object; and performing a modulation of alternately switching a period during which the first power and the second power are ON and a period during which the first power and the second power are OFF.

2. The etching method of claim 1,
wherein, in c), the first region is etched by a processing gas which does not substantially contain oxygen.

3. The etching method of claim 1,
wherein, in b), the plasma is generated from a processing gas containing the fluorocarbon containing gas, an oxygen-containing gas and an inert gas.

4. The etching method of claim 1,
wherein a ratio (duty ratio) of the period during which the pulsed power is ON to a pulse cycle is in a range from 10% to 70%.

5. The etching method of claim 1,
wherein a ratio (duty ratio) of the period during which the power of the pulse shape is ON to a pulse cycle is in a range from 50% to 60%.

6. The etching method of claim 1,
wherein the first silicon-containing material is silicon oxide, and the second material is silicon nitride.

7. An etching method comprising: providing a target object in a processing chamber, the target object including a first region, a second region and a mask, the first region being made of a first silicon-containing material, the second region being made of a second material different from the first silicon-containing material, the first region being disposed on the second region, the second region having recess, the recess being filled with the first region, the mask being disposed on the first region, the mask having an opening, the opening having a width larger than a width of the recess; performing a first sequence including a first process and a second process, the first process comprising generating, while applying a first power having a first frequency ranging from 27 MHz to 100 MHz to the processing chamber, a plasma from a fluorocarbon containing gas supplied into the processing chamber to form a fluorocarbon containing deposit on the target object, the second process comprising applying a pulsed power to the processing chamber, thereby causing the first region to be etched with fluorocarbon radicals in the fluorocarbon containing deposit; and performing a second sequence including the first process and the second process, wherein the pulsed power includes the first power and a second power having a second frequency ranging from 400 kHz to 40 MHz, wherein the first sequence is performed at a timing when the second region is exposed, and in the first sequence and the second sequence, the first process and the second process are repeated, herein, in the second sequence, the pulsed power is generated by applying the first power for plasma generation to an upper electrode provided above the target object within the processing chamber; applying the second power for ion attraction to a lower electrode provided under the target object; and performing a modulation of alternately switching a period during which the first power and the second power are ON and a period during which the first power and the second power are OFF.

8. The etching method of claim 7,
wherein the power in the first process is a continuous wave.

9. The etching method of claim 7,
wherein the power in both the first process and the second process is a pulse wave.

10. The etching method of claim 9,
wherein, in the second process, a bias power is applied, and the pulsed power and the bias power are applied synchronously.

11. The etching method of claim 7, further comprising:
a third sequence including the first process and the second process,
wherein a bias power applied in the third sequence is larger than bias powers applied in the first sequence and the second sequence.

12. The etching method of claim 7,
wherein a bias power applied in the second sequence is smaller than a bias power applied in the first sequence.

13. The etching method of claim 7,
wherein an etching time in the second sequence is set to be longer than an etching time in the first sequence.

14. The etching method of claim 7,
wherein an etching amount of the first region in the first sequence is less than an etching amount of the first region in the second sequence.

15. The etching method of claim 7,
wherein a processing time of the first sequence is shorter than a processing time of the second sequence.

16. The etching method of claim 7,
wherein, in the first process, the deposit is reduced while the deposit is formed.

17. The etching method of claim 16,
wherein, in the first process, a reduction rate of the deposit is equal to or less than 1 nm/sec.

18. The etching method of claim 7,
wherein the second process is performed by a processing gas which does not substantially contain oxygen.

* * * * *